(12) United States Patent
Okita

(10) Patent No.: US 7,550,799 B2
(45) Date of Patent: Jun. 23, 2009

(54) SEMICONDUCTOR DEVICE AND FABRICATION METHOD OF A SEMICONDUCTOR DEVICE

(75) Inventor: Yoichi Okita, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/032,628

(22) Filed: Jan. 11, 2005

(65) Prior Publication Data
US 2005/0133842 A1 Jun. 23, 2005

Related U.S. Application Data

(63) Continuation of application No. PCT/JP03/14656, filed on Nov. 18, 2003.

(30) Foreign Application Priority Data
Nov. 18, 2002 (JP) .............................. 2002-333500

(51) Int. Cl.
*H01L 29/76* (2006.01)
(52) U.S. Cl. ...................................... 257/295; 257/296
(58) Field of Classification Search ................. 257/295, 257/296
See application file for complete search history.

(56) References Cited

U.S. PATENT DOCUMENTS

| 5,796,133 A | 8/1998 | Kwon et al. |
| 5,834,348 A | 11/1998 | Kwon et al. |

FOREIGN PATENT DOCUMENTS

| JP | 6-244435 | 9/1994 |
| JP | 8-162619 | 6/1996 |
| JP | 08-162619 | 6/1996 |
| JP | 10-308515 | 11/1998 |
| JP | 11-8355 | 1/1999 |
| JP | 11-97535 | 4/1999 |
| JP | 11-214653 | 8/1999 |
| JP | 2000-150829 | 5/2000 |
| WO | WO 01/24237 | 4/2001 |

OTHER PUBLICATIONS

Japanese Office Action issued on Sep. 24, 2008 for corresponding Japanese Patent Application No. 2004-553193.

*Primary Examiner*—Long Pham
(74) *Attorney, Agent, or Firm*—Westerman, Hattori, Daniels & Adrian, LLP.

(57) ABSTRACT

In a conventional semiconductor device provided with a conventional stacked type ferroelectric capacitor, there has been caused a problem of capacitor degradation by leakage between an upper electrode and a lower electrode via an etching reside, when the efficiency of utilization of a surface area is increased by decreasing the interval between the capacitors in the in-plane direction of the substrate, as a result of the one-step annealing of the laminated from of lower electrode film/ferroelectric film/upper electrode film.

The present invention prevents leakage caused by short circuit between the lower electrode and the upper electrode, by forming plural lower electrodes, forming a ferroelectric film so as to cover the surface and sidewall surface of the lower electrodes and forming an upper electrode on the ferroelectric film so as to oppose with the lower electrodes. Further, as a result of forming the ferroelectric film so as to cover the lower electrodes continuously and by setting the interval between the lower electrodes and the thickness of the ferroelectric film to satisfy a predetermined relationship, the surface of the ferroelectric film is planarized and exposure of the sidewall is suppressed. Thereby, degradation of the capacitor is prevented.

15 Claims, 25 Drawing Sheets

SEMICONDUCTOR DEVICE AND FABRICATION METHOD OF A SEMICONDUCTOR DEVICE

CROSS-REFERENCE TO RELATED APPLICATIONS

The present invention is a continuation application filed under 35 U.S.C. 111(a) claiming benefit under 35 U.S.C. 120 and 365(c) of PCT application PCT/JP2003/014656 filed on Nov. 18, 2003, which in turn is based on Japanese priority application 2002-333500 filed on Nov. 18, 2002, the entire contents of which are incorporated herein as reference.

BACKGROUND OF THE INVENTION

The present invention relates to semiconductor devices and the fabrication method thereof, and particularly a semiconductor device having a ferroelectric capacitor and the fabrication method thereof.

With the demand of higher integration density, FeRAM devices constituting a ferroelectric memory are also subjected to the demand of further miniaturization. In relation to this, efforts are being made on the development of the FeRAM device having a stacked structure in place of the planar structure (Reference should be made to Patent Reference 1 or 2, for example). In realizing a stacked structure, an approach of etching the lower electrode film, the ferroelectric film and the upper electrode film in one step at the time of forming the capacitor part of the ferroelectric memory cell has been used for the purpose of higher integration density (Reference should be made to Patent Reference 2).

FIG. 1 is an example of the 1T1C stacked type ferroelectric memory proposed in the Japanese Patent Application 2002-249448 filed by the same applicant as the present patent application. In this example, too, a lower electrode film 111, a ferroelectric film 112 and an upper electrode film 113 are formed, and then, all these three layers are etched in one step to form a ferroelectric capacitor 101 of the stacked type over the MOS transistor Tr. Here, it should be noted that one impurity diffusion region 116 of the MOS transistor Tr is connected electrically to the lower electrode 111 of the ferroelectric capacitor 101 via a conductive plug 105a, while the other impurity diffusion region 116 is connected to a bit line 109 via conductive plugs 105b, 106, 108 and a conductive pad 107. Further, a gate 118 of the MOS transistor Tr forms the wiring of the word line.

In order to improve the surface area utilization efficiency, it is necessary at the time of the one-step patterning of the lower electrode film 111, the ferroelectric film 112 and the upper electrode 113, to carry out the etching with an angle close to the vertical angle. In order to obtain such a capacitor shape characterized by little tapering, it becomes necessary to use a high temperature etching technology that uses a chemical reaction while maintaining the wafer at a high temperature of about 400° C.

Further, there is a need of maintaining near vertical taper angle and further the need of preventing electrical contact between the upper electrode and the lower electrode via sidewall deposits. On the other hand, such various requirements urges the use of advanced etching technology such as the high temperature etching technology. On the other hand, even when such high temperature etching technology is used, it is difficult to form a capacitor free from leakage between the upper electrode and the lower electrode with reliability.

Further, because of the one-step etching applied to the lower electrode film 111, the ferroelectric film 112 and the upper electrode film 113, it should be noted that the sidewall of the ferroelectric film 112 is exposed in each capacitor cell. Although the surface of the patterned capacitor and the substrate surface are covered by a capacitor protection film 104, the use of such a capacitor protection film 104 cannot completely prevent the penetration of water through the protection film 104 and through the sidewall of the ferroelectric capacitor 112 in the processes thereafter conducted in reducing ambient such as a film formation process or thermal annealing process. Thereby, the reducing reaction associated with the penetrated hydrogen molecules causes the problem that the capacitor performance is degraded. In the case PZT family ferroelectrics are used for the material of the ferroelectric capacitor, in particular, the material contains Pb, while Pb easily causes decoupling of oxygen. Thereby, there occurs loss of lead, and severe degradation may be caused.

When such degradation of capacitor is caused, there occurs a reduction of effective area in the final capacitor, contrary to the effort of improving the surface area utilization efficiency by conducting one-step etching with near vertical angle.

After the ferroelectric capacitor 101 is thus formed with the one-step etching, a wiring layer constituting a plate line 103 is needed for interconnecting isolated upper electrodes 113.

Patent Reference 1 Japanese Laid-Open Patent Application 11-97535

Patent Reference 2 Japanese Laid-Open Patent Application 10-308515

SUMMARY OF THE INVENTION

Accordingly, it is a general object of the present invention to provide a novel and useful semiconductor device and the manufacturing method thereof wherein the foregoing problems are eliminated.

Another and more specific object of the present invention is to provide a semiconductor device having a reliable ferroelectric capacitor wherein efficiency of surface area utilization is improved and capacitor degradation and leakage are eliminated.

Another object of the present invention is to provide a method of fabricating a semiconductor device wherein degradation of the capacitor is suppressed while eliminating the need of using advanced high temperature etching.

In order to achieve the object, the present invention provides, in a first aspect thereof, a semiconductor device having a plurality of lower electrodes connected electrically to one of impurity diffusion regions of transistors formed on a semiconductor substrate, a ferroelectric film covering a surface and a sidewall surface of said plural lower electrodes, and an upper electrode disposed on the ferroelectric film so as to oppose to the lower electrode.

According to the present invention, the surface and the sidewall surface of the lower electrode is covered with the ferroelectric film, and leakage associated with short circuit between the lower electrode and the upper electrode, caused by conductive residues, or the like, formed at the time of formation of the upper electrode, is prevented. Further, the interval between the ferroelectric capacitors formed by the lamination of lower electrode/ferroelectric film/upper electrode is reduced in the in-plane direction of the substrate, and the efficiency of surface area utilization is improved.

With such a semiconductor device, it is also possible to construct the ferroelectric film so as to cover the plural lower electrodes continuously except for predetermined regions. Thereby, exposure of the sidewall surface of the ferroelectric film is suppressed, and the capacitor degradation started from the sidewall of the ferroelectric capacitor is effectively prevented. Thus, it becomes possible to form a stable ferroelectric capacitor.

Further, with such a semiconductor device, the plural lower electrodes are disposed with a predetermined interval satisfying the relationship $$W < T_{FER} \times 2$$

where W represents the interval between the lower electrodes while $T_{FER}$ represents the thickness of the ferroelectric film.

In the region in which the foregoing relationship is satisfied, the surface of the ferroelectric film covering the lower electrode continuously has a flat surface between adjacent lower electrodes, and the sidewall is exposed only at the predetermined region. By minimizing the exposed sidewall region, it becomes possible to prevent the degradation of capacitor caused by the effect of process damages originating from the process steps to be conducted later.

Further, by planarizing the surface of the ferroelectric film that covers the ferroelectric film continuously, it becomes possible to reduce the process residuals of the upper electrode sufficiently.

With such a semiconductor device, there are further provided another conductive plug contacting with another impurity diffusion region of the transistor and an electrode pad forming the same layer as the lower electrode and covering the surface of the foregoing another conductive plug and the surrounding art thereof, wherein the electrode pad is disposed so as to satisfy the relationship $$Wa < T_{FER} \times 2$$

where Wa represents the interval between the electrode pad and the lower electrode and $T_{FER}$ represents the thickness of the ferroelectric film.

By satisfying the foregoing relationship, the surface of the ferroelectric film covering the electrode pad and the lower electrode adjacent to the electrode pad is planarized, and exposure of the sidewall of the ferroelectric film is suppressed further.

With such a semiconductor device, it should be noted that the upper electrode has the shape of plate line and functions both as an upper electrode and a plate line. With this, the need of providing the plate line connecting the isolated upper electrodes is eliminated.

Further, the semiconductor device includes a conductive plug connecting the lower electrode and one of the impurity diffusion regions, a plug oxidation protection film interposed between the conductive plug and the lower electrode so as to cover the surface of the conductive plug and the surrounding region thereof, an insulation film forming the same layer as the plug oxidation protection film and covering the region other than the surface of the conductive plug and the surrounding region thereof, and an adhesive film interposed between the insulation film and the ferroelectric film. Here, it should be noted that there holds the relationship $$t1 \geq t2 + t3,$$

where t1 represents the thickness of the plug oxidation protection film, t2 represents the thickness of the insulation film and t3 represents the thickness of the adhesive film.

As a result of existence of the adhesive film satisfying such a film thickness relationship, the ferroelectric film is held stably and with excellent adhesion, and peeling of the film is prevented.

For the adhesive film, an aluminum oxide film, a titanium oxide film, a PZT film, or the like, may be used.

According to the second aspect of the present invention, there is provided a method of fabricating a semiconductor device, comprising the steps of:

(a) forming a conductive plug in connection with one of impurity diffusion regions of a transistor formed on a semiconductor substrate;

(b) forming a lower electrode connected electrically to the conductive plug with a predetermined interval;

(c) forming a ferroelectric film so as to cover said lower electrode continuously;

(d) forming an upper electrode on said ferroelectric film with a predetermined pattern;

(e) removing said ferroelectric film selectively at a predetermined region; and (f) forming a contact in said predetermined region for electrical connection with another impurity diffusion region of said transistor.

With this fabrication method, the need of one-step etching of the upper electrode, the ferroelectric film and the lower electrode is eliminated and the patterning of the ferroelectric film can be minimized. Thus, by minimizing exposure of the sidewall of the ferroelectric film, it becomes possible to prevent the degradation of the capacitor starting from the ferroelectric sidewall. Further, it becomes possible to eliminate the concern about leakage between the upper and lower electrodes at the time of the one-step etching process.

In the foregoing formation step of the lower electrode, the lower electrode is formed so as to satisfy the relationship $$W < T_{FER} \times 2$$

except for the foregoing predetermined region, wherein W represents the interval between the lower electrodes and $T_{FER}$ represents the thickness of the ferroelectric film.

By disposing the lower electrodes so as to satisfy the foregoing relationship, the surface of the ferroelectric film continuing between adjacent lower electrodes is planarized except for the foregoing predetermined regions. Thus, the upper electrode film is formed also on the flat surface, and the effect of etching residues formed at the time of patterning of the upper electrode can be suppressed.

Preferably, the forming step of the upper electrode includes the step of patterning the upper electrode in the form of the plate line. With this, the step for forming the plate line for connecting the isolated upper electrodes is eliminated, and the process can be simplified.

Other features and effects of the present invention will be understood more clearly from the following detained description made with reference to the drawings.

BRIEF DESCRIPTION OF THE DRAWINGS

FIG. 4A is a top plan view diagram showing a first part of the fabrication process of the semiconductor device according to the first embodiment, while

FIG. 6A is a top plan view diagram showing a third part of the fabrication process of the semiconductor device according to the first embodiment, while

FIG. 7A is a top plan view diagram showing a fourth part of the fabrication process of the semiconductor device according to first embodiment, while

DETAILED DESCRIPTION OF THE PREFERRED EMBODIMENTS

Hereinafter, the present invention will be explained for the embodiments with reference to the drawings.

Figure 1:
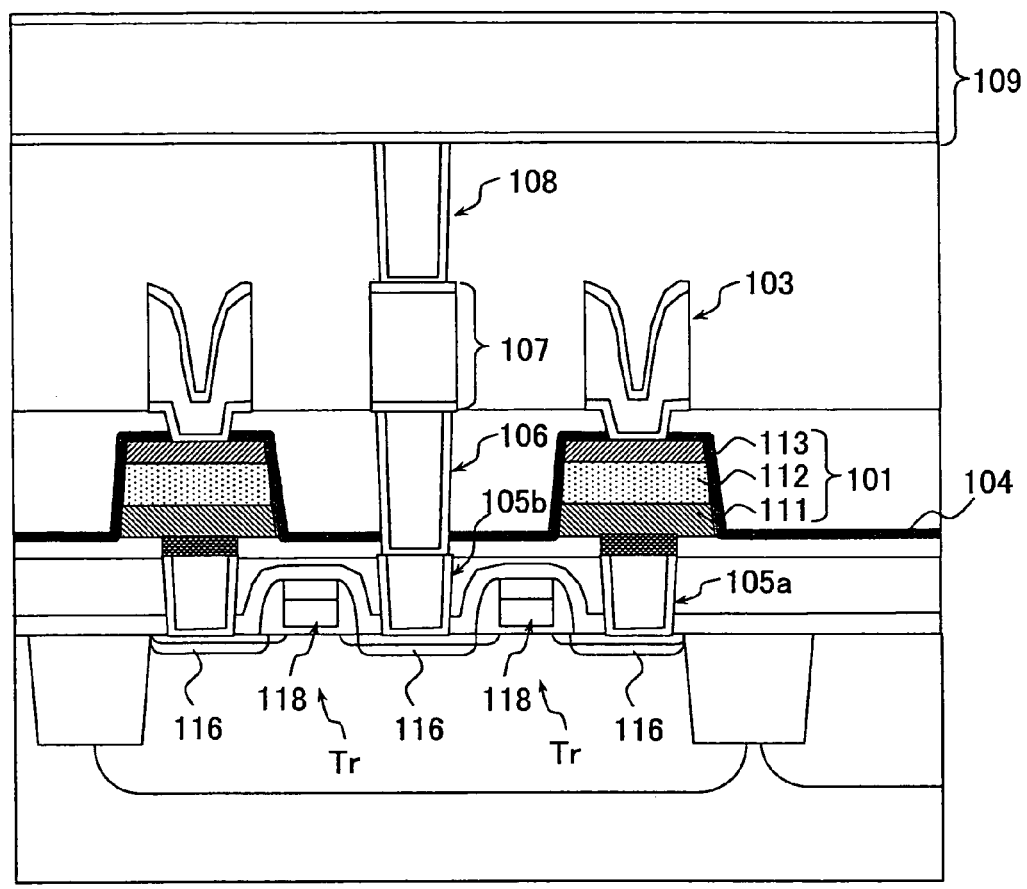
FIG. 1 is a cross-sectional view diagram showing an example of the stacked-type ferroelectric memory.
Figure 2:
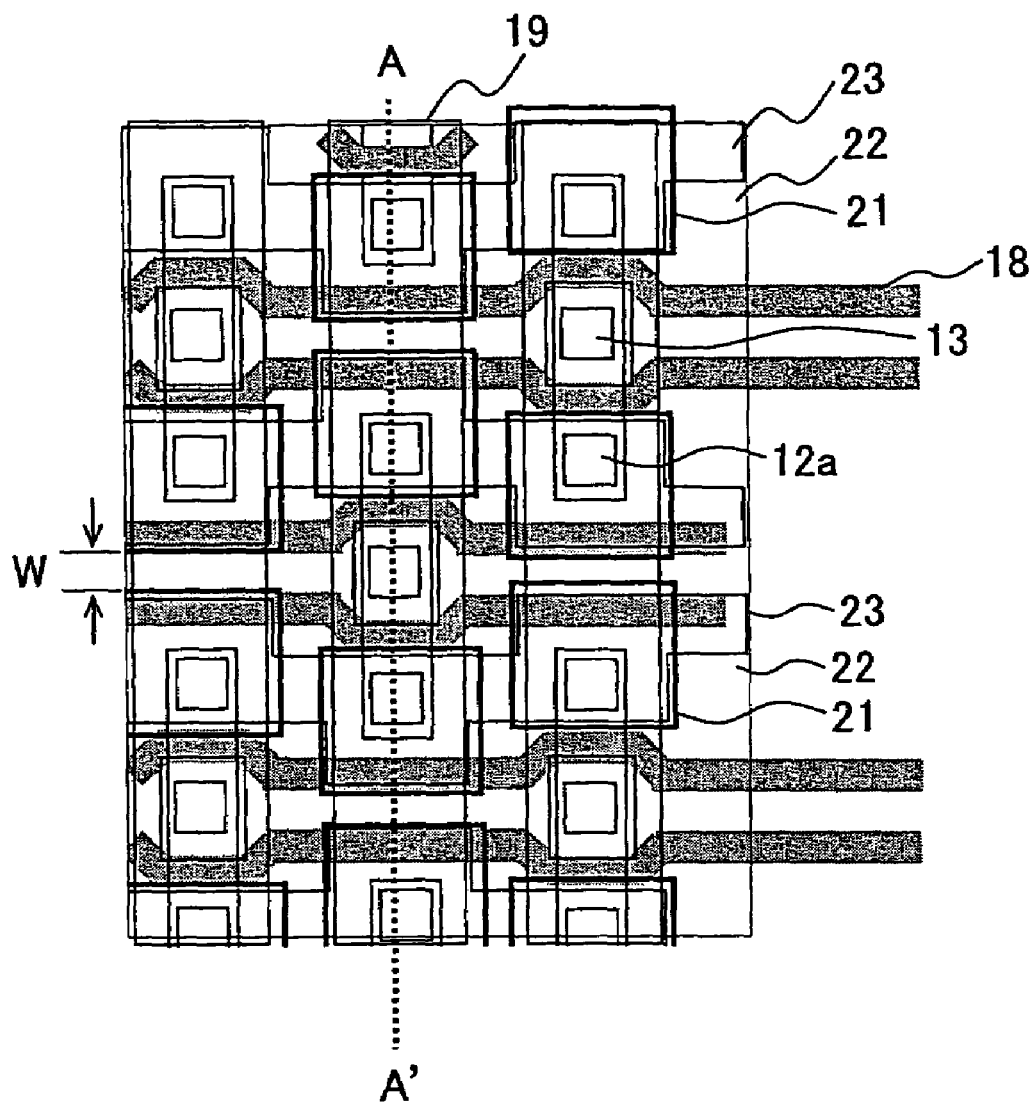
FIG. 2 is a top plan view diagram of a semiconductor device according to a first embodiment of a present invention.
Figure 3:
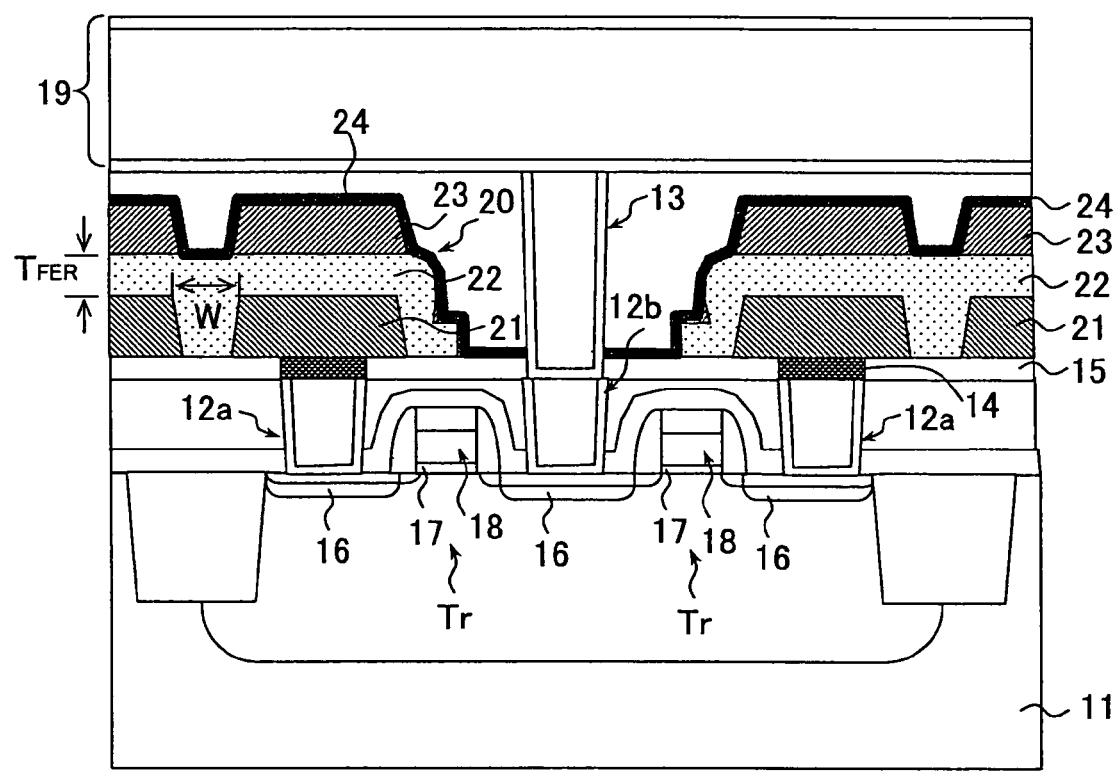
FIG. 3 is an A-A' cross-sectional view diagram of the semiconductor device shown in FIG. 2.

FIG. 2 is a top plan view diagram of a semiconductor device according to a first embodiment of the present invention, while FIG. 3 is a cross-sectional view diagram taken along an A-A' line of FIG. 2. As shown in FIGS. 2 and 3, the semiconductor device according to the first embodiment includes transistors Tr formed on a semiconductor substrate, a plurality of lower electrodes 21 each connected to a diffusion region 16 of the corresponding transistor Tr electrically, a ferroelectric film 22 covering the plural lower electrodes 21 except for predetermined regions, and an upper electrode provided on the ferroelectric film 22 so as to oppose with the lower electrode 21, wherein the continuous ferroelectric film 22 has a flat surface in the region thereof where the interval W between mutually adjacent lower electrodes 21 satisfies a predetermined condition. The lower electrode 21, the ferroelectric film 22 corresponding to the lower electrode 21 and the upper electrode opposing to the lower electrode constitute a ferroelectric capacitor 20.

The lower electrode 21 of the ferroelectric capacitor 20 is connected to one of the impurity diffusion regions 16 of the transistor Tr electrically via the conductive plug 12a, while the other impurity diffusion region 16 is connected electrically to the bit line 19 via the conductive plug 12b and the bit line contact 13.

Although the ferroelectric film 22 is not continuous in the regions between a pair of ferroelectric capacitors 20 disposed across a bit line contact 13, the ferroelectric film 22 does extend continuously over the part between adjacent lower electrodes 21 except for the foregoing regions.

The ferroelectric film 22 has a flat surface in the region where the condition $$W < T_{FER} \times 2 \tag{1}$$

is satisfied, wherein W represents the interval between adjacent lower electrodes 21 while $T_{FER}$ represents the thickness of the ferroelectric film 22. Thus, by disposing the lower electrodes 21 such that the separation between adjacent lower electrodes 21 satisfies the foregoing condition (1) except of the region where the bit line contact 13 is formed, it becomes possible to realize a flat surface for the ferroelectric film covering the lower electrode 21 continuously. Consequently, the surface of the upper electrode formed on the ferroelectric film 22 in opposite relationship to the lower electrode 21 becomes also flat. Here, it should be noted that the ferroelectric film 22 is formed under the condition that deposition of the ferroelectric film 22 occurs on the top surface and on the side surface of the patterned lower electrode 21 with generally identical film thickness.

In the first embodiment, the upper electrode 23 is not isolated but has a shape of the plate line pattern. Because the upper electrode 23 functions as the plate line as it is, there is no need of providing additional interconnection wiring.

Thus, with the semiconductor device of the first embodiment, the ferroelectric film 22 of the ferroelectric capacitor 20 covers the lower electrode 21 continuously except for the region surrounding the bit line contact 13, and unwanted exposure of the sidewall of the ferroelectric film 22 is minimized. As a result, degradation of the ferroelectric film such as the one caused by process degradation including loss of lead, is successfully minimized even after various processes are conducted in the reducing ambient. Thereby, the reliability of operation is improved.

Further, by setting the interval between adjacent lower electrodes 21 and the thickness of the ferroelectric film 22 so as to satisfy the condition (1) except for the region surrounding the bit line contact 13, it becomes possible to achieve a flat surface free from steps for the ferroelectric film 22 covering the lower electrode 21 continuously. With such a construction, it becomes possible to minimize the etching residue at the time of formation of the upper electrode (or plate line) 23, and the risk of causing short circuit or the like is reduced.

FIGS. 4A-8 are diagrams showing the fabrication process of the semiconductor device of the first embodiment shown in FIGS. 2 and 3.

Figure 4A:
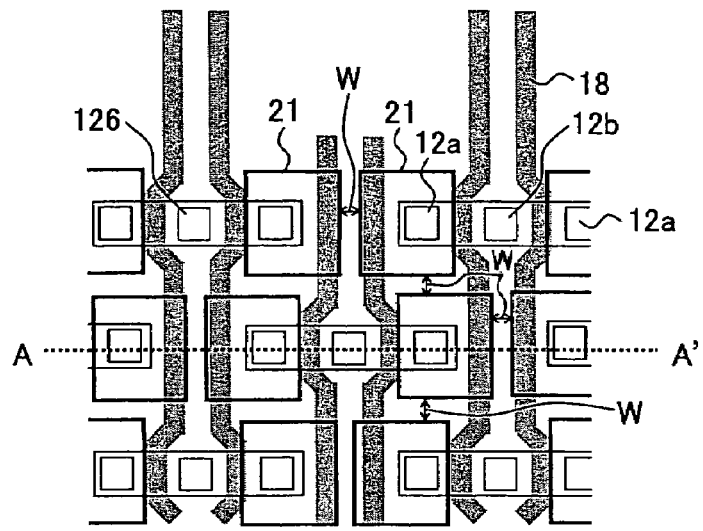
Figure 4B:
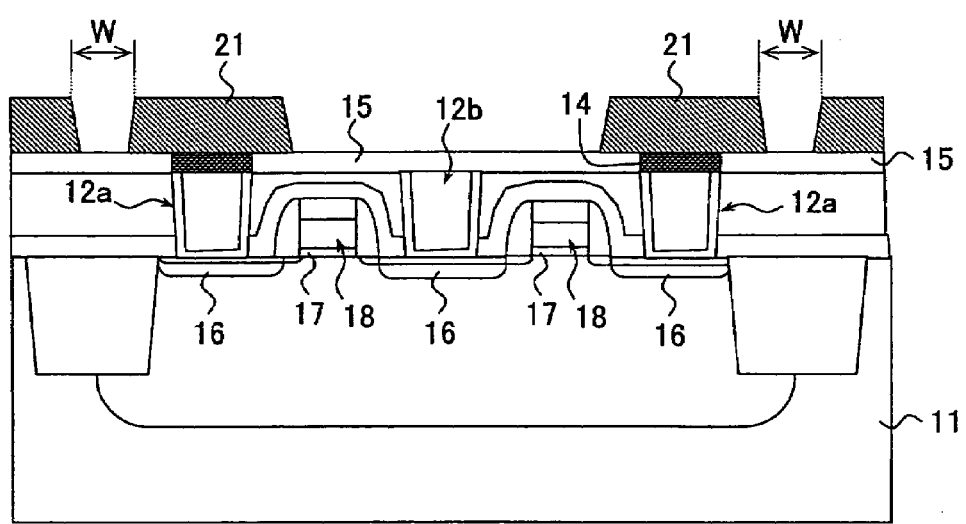
FIG. 4B is an A-A' cross-sectional view diagram of FIG. 4A.

First, there are formed lower electrodes 21 over the transistors Tr formed on the semiconductor substrate with a predetermined pattern as represented in FIGS. 4A and 4B. Here, it should be noted that FIG. 4A is a top plan view shoring the step of forming the lower electrode, while FIG. 4B is a cross-sectional view taken along A-A' line of FIG. 4A.

Prior to the formation of the lower electrode 21, there is conducted a process of forming the transistor Tr by forming a gate 18 constituting a part of the word line on the semiconductor substrate 11 via a gate insulation film and by forming the impurity diffusion regions 16, while any arbitrary processes can be used for the formation of the transistor, and the description thereof will be omitted. Further, any arbitrary processes can be used for the formation of the conductive plug 12a connected to one of the impurity diffusion regions 16 of the transistor and for the formation of the conductive plug 12b to be connected to the bit line in the later processes. Thus explanation of such a process will be omitted. In the example of FIGS. 4A and 4B, the conductive plugs 12a and 12b are formed of a tungsten (W) plug covered with a Ti/TiN film.

After formation of the conductive plugs 12a and 12b, a conductive plug oxidation protection film 14 is formed on the exposed surface of the conductive plug 12a. Such a plug oxidation protection film 14 can be formed by sputtering of an Ir film or an Ir oxide film on the entire surface by sputtering, followed by photolithography and etching process. Thereafter, an insulation film 15 is deposited and surface polishing is conducted until the surface of the plug oxidation protection film 14 is exposed. Here, it is possible to use an SiON film, an alumina film or a titania film of the insulation film 15. By using an SiON film, an alumina film or a titania film for the insulation film 15, it becomes also possible to protect the conductive film 12b from the oxidation associated with the thermal annealing processes to be conducted later. Thereafter, the material for the lower electrode is formed on the entire surface, and the lower electrode 12 is formed by conducting a patterning process to form a particular shape. The lower electrode 21 may be formed of any of Pt, Ir, an oxide film of Ir, or a lamination of these.

It should be noted that the lower electrodes 21 are formed with increased mutual interval between adjacent lower electrodes in those regions where the bit line contact is to be formed later. In other regions, the interval W between adjacent lower electrodes 21 is set so as to satisfy the condition $$W < T_{FER} \times 2 \quad (2)$$

in view of the thickness $T_{FER}$ of the ferroelectric film to be formed in the next step.

Figure 5:
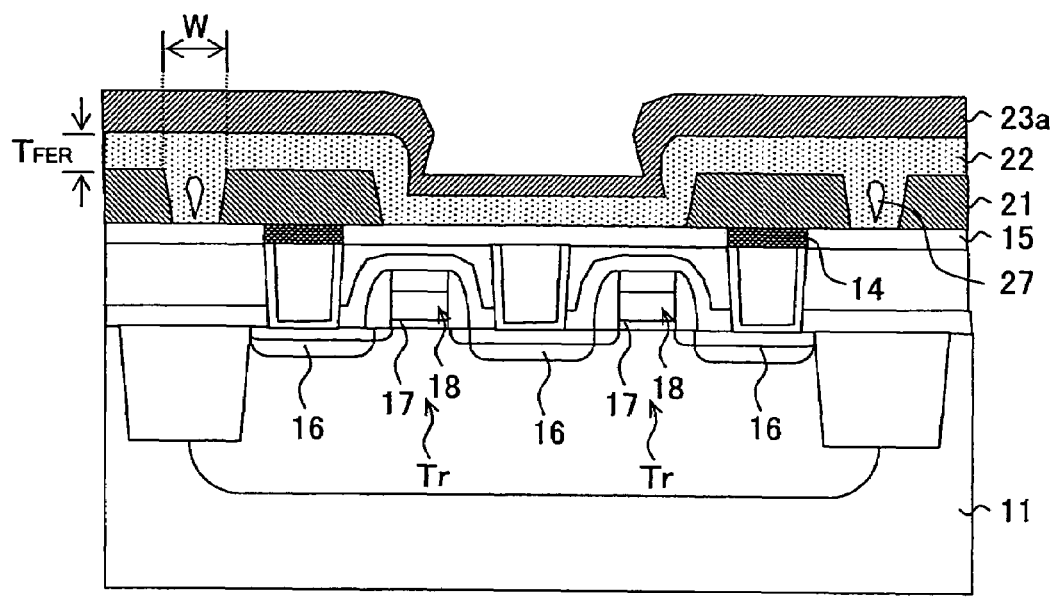
FIG. 5 is a cross-sectional view diagram showing a second part of the fabrication process of the semiconductor device according to the first embodiment.

Next, the ferroelectric film 22 and the upper electrode film 23a are formed so as to cover the lower electrodes 21 and the entire substrate surface as shown in FIG. 5. For the ferroelectric film 22, it is possible to use any of PZT (Pb(Zr,Ti)O$_3$) family ferroelectrics, SBT (SrBi$_2$Ta$_2$O$_9$) family ferroelectrics, or other metal oxide ferroelectrics. The ferroelectric film is formed with the thickness of 200 nm and is subjected to crystallization by conducting an annealing process in the ambient containing oxygen.

While it is noted that such formation of the ferroelectric film 22 may cause a step formation in the region where the distance between the lower electrodes 21 is increased for formation of the bit line contact in the later process, the ferroelectric film 22 shows a flat surface in the region where the interval W between adjacent lower electrodes 21 satisfies the condition (1). In the case a PZT film is formed for the ferroelectric film 22 by a sputtering process, for example, it is noted that there is formed a gap 27 between the lower electrodes 21, while such gap 27 does not provide any particular effect on the electric properties of the capacitor. In the case MO-CVD process or SOL-GEL process is used for the formation of the ferroelectric film 22, there occurs no formation of such a gap 27.

Figure 6A:
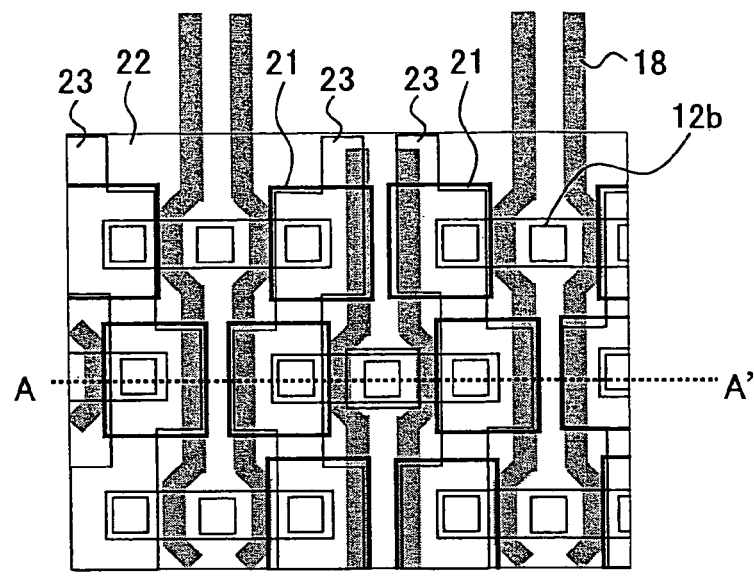
Figure 6B:
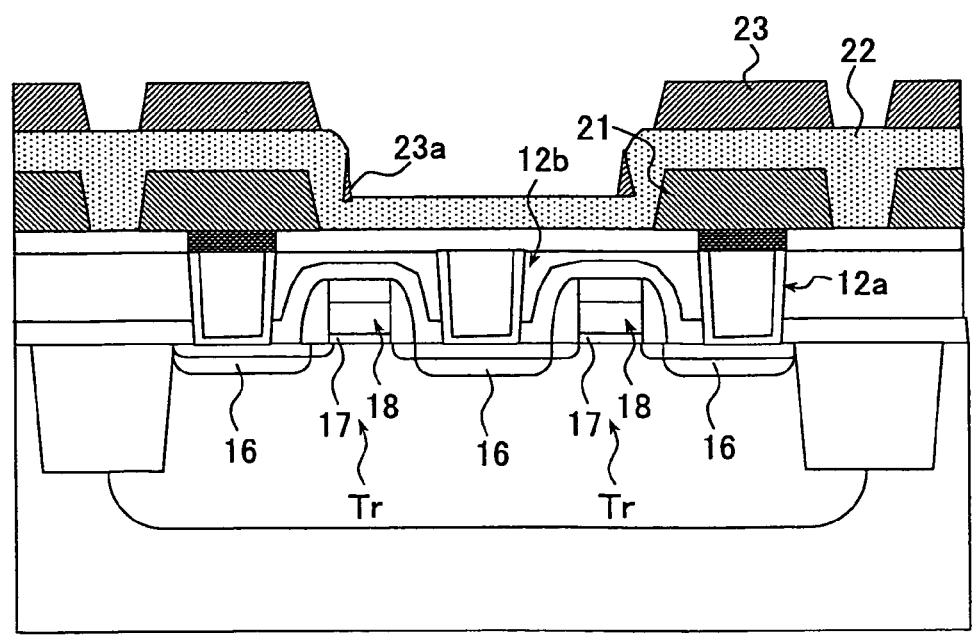
FIG. 6B is an A-A' cross-sectional view diagram of FIG. 6A.

Next, as shown in the top plan view of FIG. 6A or in the A-A' cross sectional view of FIG. 6B, the upper electrode film 23a is patterned according to a predetermined shape, and with this, the upper electrode 23 is formed. The upper electrode film 23a may be formed of the same material as the lower electrode 21 or may be formed of a difference material. In the first embodiment, the upper electrode 23 functions also as a plate line. As explained, the ferroelectric film 22 has a flat surface free from steps in the region where the lower electrodes 21 are disposed so as to satisfy the condition (1). When the upper electrode film 23a thus formed on a flat surface is subjected to etching, there occurs no formation of etching residue from such upper electrode film 23a.

On the other hand, in the part where the condition (1) is not met, in other words, in the region where the bit line contact is to be formed in the later processes, there appears a step in the ferroelectric film 16, and because of this, there is caused some residue formation of the upper electrode film 23a at the sidewall part of the such a step. However, this residue does not make a contact with other upper electrodes (plate line pattern) 23, and thus, there is caused no problem with such a residue.

Figure 7A:
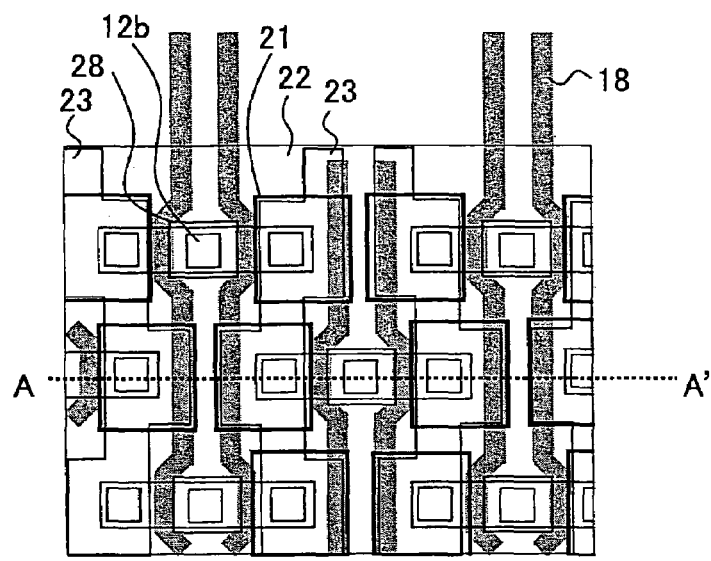
Figure 7B:
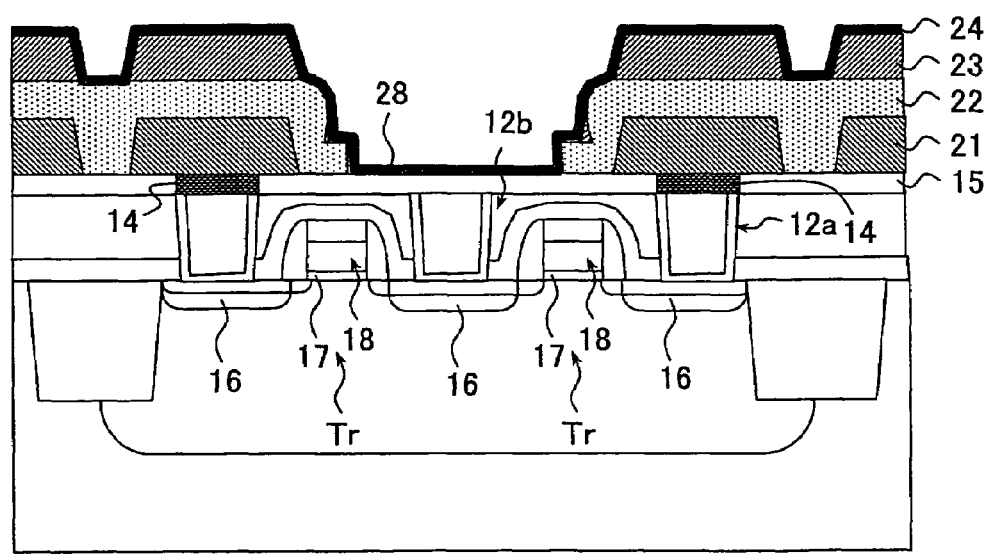
FIG. 7B is an A-A' cross-sectional view diagram of FIG. 7A.

Next, as shown in the top plan view of FIG. 7A and the A-A' cross-sectional view of FIG. 7B, the ferroelectric film 22 is removed from the region where the bit line contact is to be formed, and there is formed a bit line contact opening 28. Further, there is formed a capacitor protection film 24 covering the entirety of the upper electrode 21, the ferroelectric film 22 and the insulation film 25. Generally, it is hard to etch a ferroelectric film. By conducting the removal in this stage in which the ferroelectric film alone is existing on the insulation film 15, various problems encountered in the later processes of bit line contact hole formation, are successfully avoided. The removal of the ferroelectric film 22 is conducted by an RIE process in Ar-containing ambient while using a resist mask or a hard mask. After the RIE process, an annealing is conducted for recovering the damages of the ferroelectric film 22. Thereafter, the capacitor protection film 24 is formed so as to cover the entire surface. For the capacitor protection film 24, an aluminum oxide film, a PZT film, a titanium oxide film, or the like, may be used.

Throughout the etching and the recovery annealing of the ferroelectric film 22 and the formation of the capacitor protection film, it is possible to suppress the oxidation of the conductive plug 12b to be connected to the bit line contact in the later process, by optimizing the material of the insulation film 15 above the conductive plug 12b or the material of the capacitor protective film 24. As explained above, an SiON film or an alumina film is used for the insulation film 15. Together with the capacitor protection film 24, the insulation film 15 prevents the oxidation of the conductive plug 12b, and good electrical connection is guaranteed.

Figure 8:
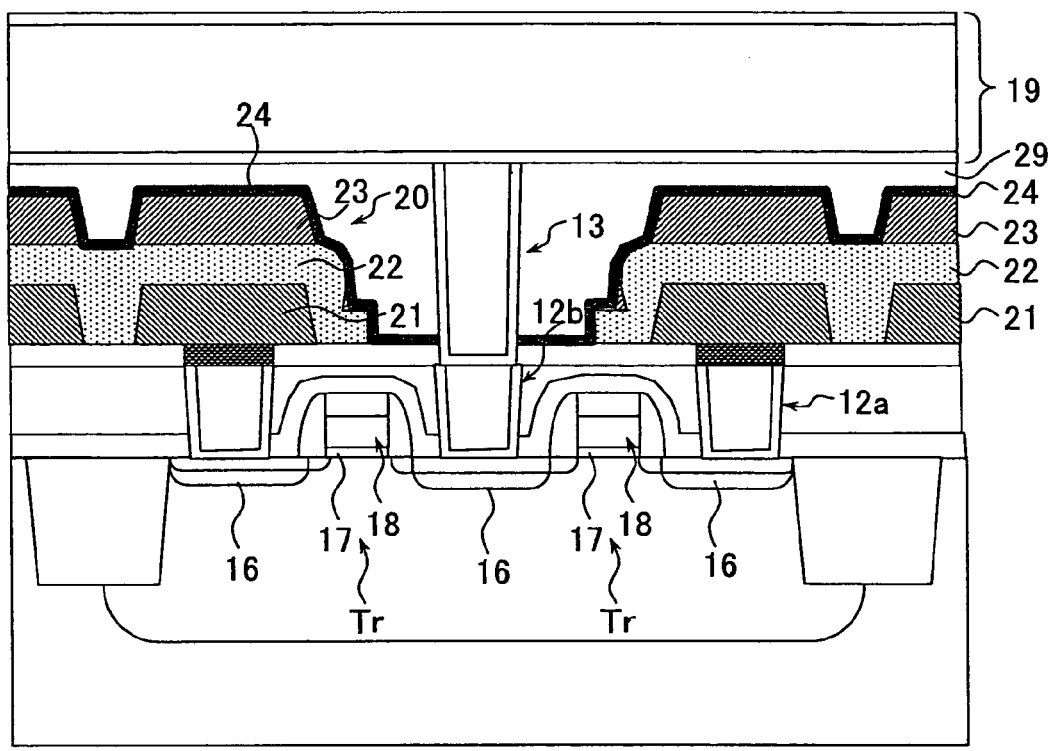
FIG. 8 is a cross-sectional view diagram showing a fifth part of the fabrication process of the semiconductor device according to the first embodiment.

Next, as shown in FIG. 8, the interlayer insulation film 29 is deposited on the entire surface by a CVD process, or the like. After planarization of the surface, there is formed a contact hole reaching the conductive plug 12b.

After formation of a TiN film on the inner wall surface of the contact hole, the interior of the contact is filled with tungsten (W), for example, and there is formed a bit line contact 13 therein. Thereafter, a multilayer metal wiring 19 is formed in connection with the bit line contact 13 as the bit line 19.

According to the fabrication process of the first embodiment, exposure of the ferroelectric sidewall of the capacitor throughout the fabrication process is minimized, and it is possible to suppress the deterioration of the ferroelectric film 22 even after processing in reducing ambient has been conducted.

Further, because the upper electrode 23 functions as the plate line, it is possible to eliminate the process of separately forming the plate line.

Further, the concern of capacitor leakage at the time of one-step etching of the upper electrode, the ferroelectric film and the lower capacitor, is eliminated.

Figure 9:
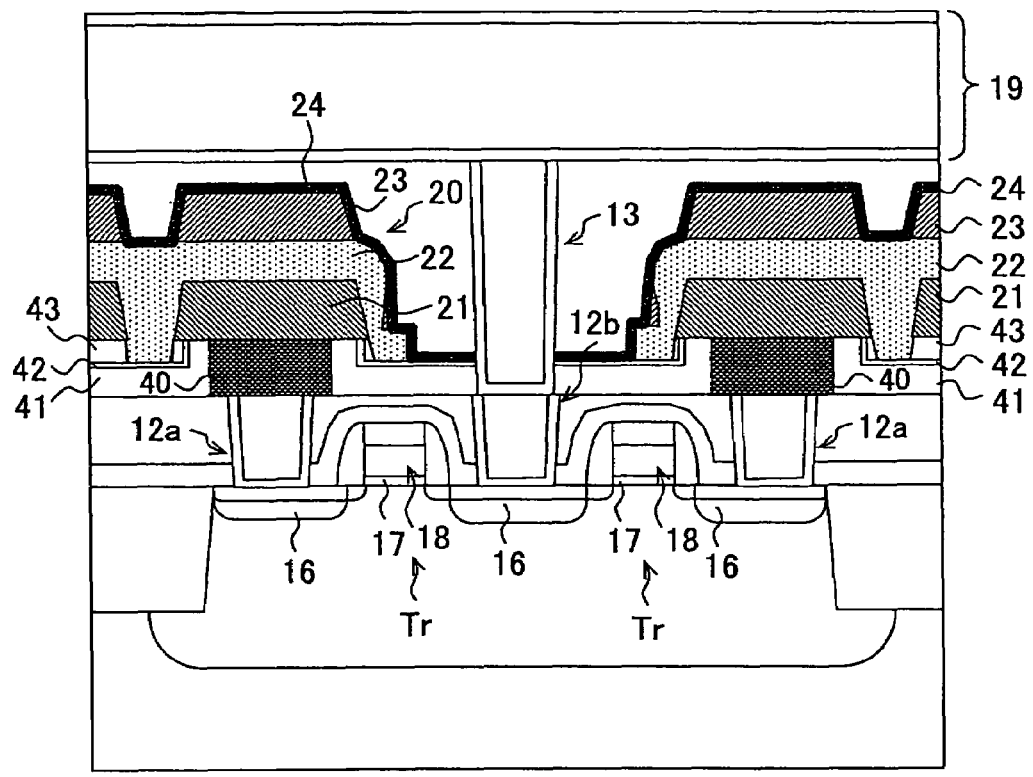
FIG. 9 is a cross-sectional view diagram showing a first modification of the semiconductor device of the first embodiment.

FIG. 9 is a diagram showing a first modification of the semiconductor device of the first embodiment, wherein it should be noted that this first modification takes into consideration the issue of adherence between the underlying film and the ferroelectric film of the capacitor. In the case a TEOS film is used for the underlying film, the adherence to the ferroelectric film is deteriorated, and in the worst case, there may be caused peeling in the ferroelectric film. Because of this, there is a need to provide a structure of strong adherence between the underlying film and the ferroelectric film. Thus, there is interposed an insulating adhesive film 42 and a second interlayer insulation film 43 between the first interlayer insulation film 41, which constitutes the underlying film of the ferroelectric capacitor 20 and the ferroelectric film 22.

FIGS. 10-13 show the fabrication process of the semiconductor device shown in FIG. 9.

Figure 10:
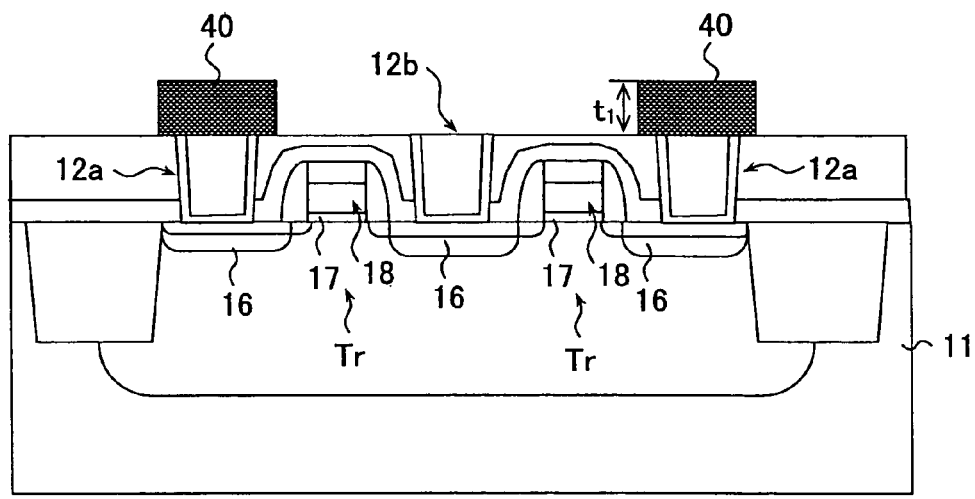
FIGS. 10-13 are cross-sectional view diagrams showing the fabrication process of the first modification of the first embodiment.

First, as shown in FIG. 10, there is formed a plug oxidation protection film 40 of a conductive film on the surface of the conductive plug 12a connected to one of the impurity diffusion regions 16 of the transistor Tr with a thickness of t1. The plug oxidation protection film 40 may be formed by first depositing an Ir film or an Ir oxide film on the entire planarized surface of the substrate with the thickness t1, followed by etching so as to cover the exposed surface of the conductive plug 12a and the part thereof surrounding the foregoing exposed surface, while using a resist mask or a hard mask. With the etching, the surface of the conductive plug 12b connected to the other of the impurity diffusion regions of the transistor Tr is exposed.

Figure 11:
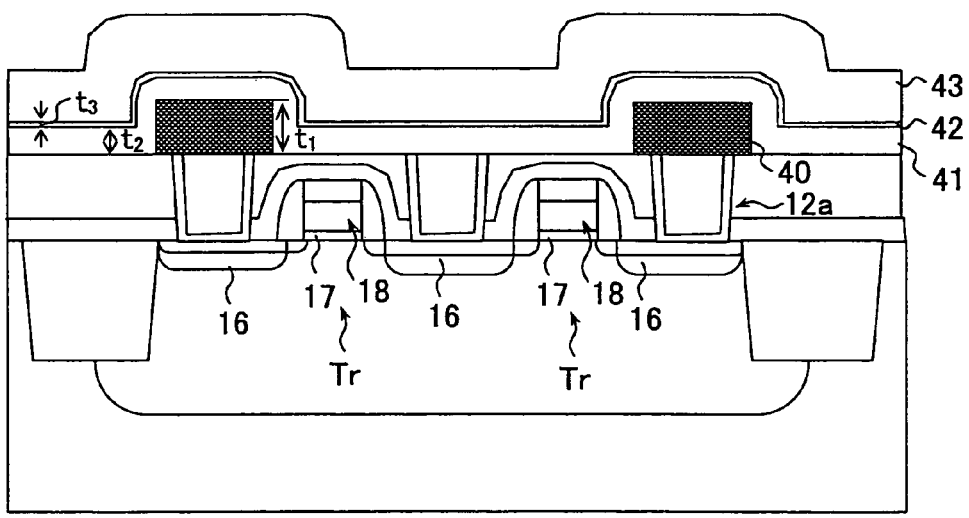

Next, as shown in FIG. 11, the first interlayer insulation film 41, the adhesion film 42 and the second interlayer insulation film 43 are formed consecutively so as to cover the plug oxidation protection film 40 and also the entire surface of the substrate. For the first interlayer insulation film, it is possible to use an SiON film or an SiN film, while the insulating adhesion film 42 may be formed of an aluminum oxide film, a PZT film or a titanium oxide film. Further, the second interlayer insulation film may be formed of an SiON film or an SiN film.

Thereby, the thickness of the first interlayer insulation film 41 and the thickness of the adhesion layer 42 are set such that the total of the thickness of the first interlayer insulation film 41 and the thickness of the adhesion film 42 does not exceed the thickness of the plug oxidation protection film 40. Thus, the first interlayer insulation film 41 and adhesion film 42 are formed so as to satisfy the relationship $$T1 \geq t2+t3 \tag{2}$$

where t1 represents the thickness of the plug oxidation protection film 40, t2 represents the thickness of the first interlayer insulation film and t3 represents the adhesive film 42.

Figure 12:
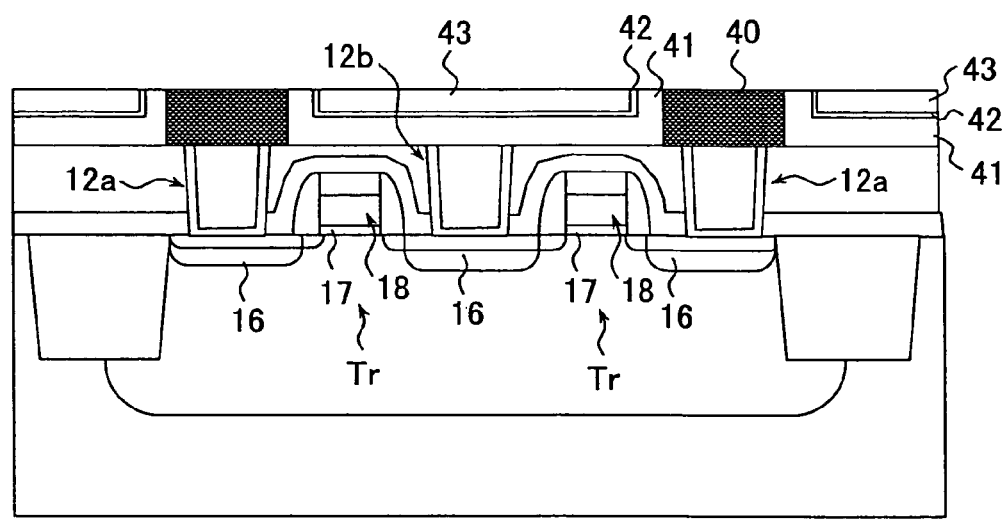

Next, as shown in FIG. 12, the second interlayer insulation film 43 is planarized by a CMP process, until the surface of the plug oxidation protection film 40 is exposed. Because the first interlayer insulation film 41 and the adhesion film 42 are formed so as to satisfy the condition (2) in this planarization step, the adhesion film 42 is not vanished but remains in the region other than the plug oxidation protection film 40.

Figure 13:
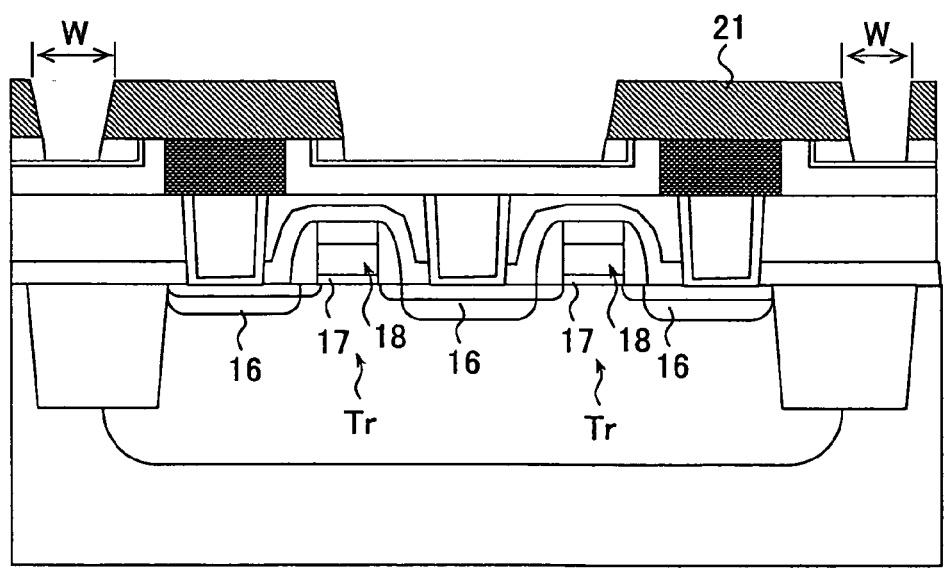

Next, as shown in FIG. 13, there is formed a lower electrode 21 of the capacitor on the plug oxidation protection film 40. As explained above, the interval W between the lower electrodes 21 is set so as to satisfy the condition (1) except for the region where the bit line contact is to be formed. With this first modification, the surface of the adhesion film 42 is exposed at the time of patterning the lower electrode 21 by removing the second interlayer insulation film 43 by way of overetching.

Next, while not illustrated, the PZT ferroelectric film 22 and the upper electrode film 23a are formed consecutively on the exposed adhesive film 42 and the lower electrode, and a state corresponding to FIG. 5 is reached. This state is different over the state of FIG. 5 in that the ferroelectric film 22 is formed on the adhesive film 42. Thus, there occurs no peeling in the ferroelectric film 22 and the ferroelectric film 22 is held stably. The processes thereafter are similar to those explained with reference to FIGS. 6a-8 and the description thereof will be omitted.

In this way, according to the first modification of the first embodiment, it becomes possible to improve the adherence between the ferroelectric film and the underlying film in addition to the effective prevention of the capacitor deterioration starting from the ferroelectric film sidewall, and a more stable ferroelectric capacitor cell is constructed.

Figure 14:
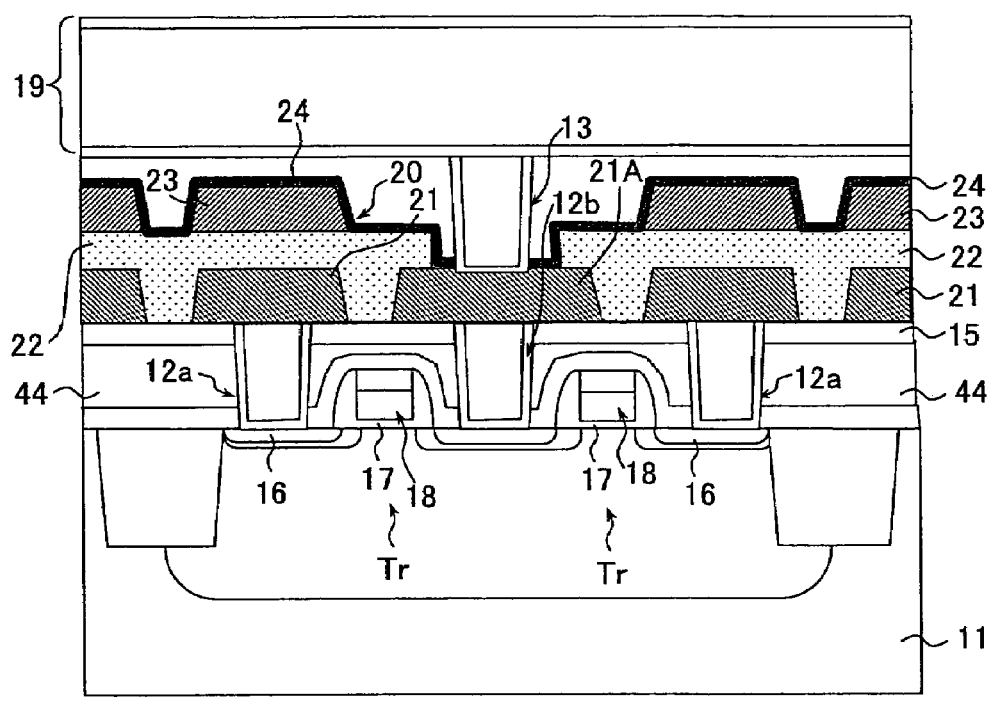
FIG. 14 is a cross-sectional view showing a second modification of the semiconductor device according to the first embodiment.

FIG. 14 is a diagram showing a second modification of the semiconductor device of the first embodiment. In this second modification, the issue of decreasing the steps formed in the ferroelectric film in the region where the bit line contact is formed is addressed. Further, this second modification addresses the issue of simplification of the oxidation prevention structure of the conductive plug. In the drawings, those parts corresponding to the parts explained previously are designated by the same reference numerals and the description thereof will be omitted.

In the first embodiment shown in FIG. 3, it should be noted that the foregoing condition (1) is not met in the region of the bit line contact 13, and thus, there appears steps in the ferroelectric film in such a region. Thus, as shown in FIG. 14, there is formed an electrode pad 21A in the same layer to the lower electrode 21 between the bit line contact 13 and the conductive plug 12b.

Further, by simplifying the oxidation protection structure of the conductive plug of the first embodiment and using an SiON film or an alumina film or a titania film for the insulation film 15, it becomes possible to protect the conductive plugs 12a and 12b from oxidation associated with the thermal processing used in the later processes, together with the lower electrode 21 and the electrode pad 21A.

Figure 15:
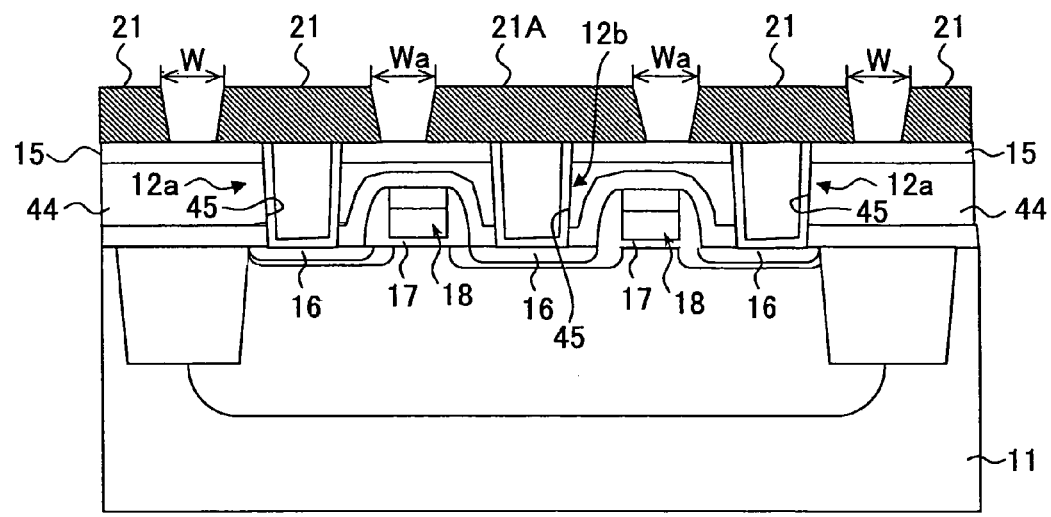
FIGS. 15-17 are cross-sectional view diagrams showing the fabrication process of the second modification of the first embodiment.
Figure 16:
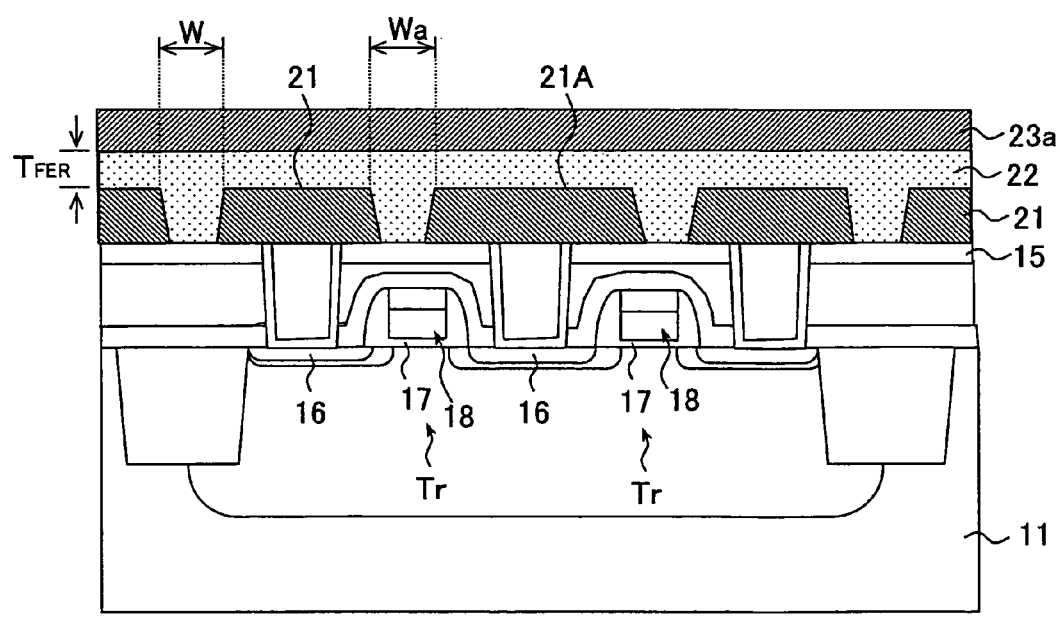
Figure 17:
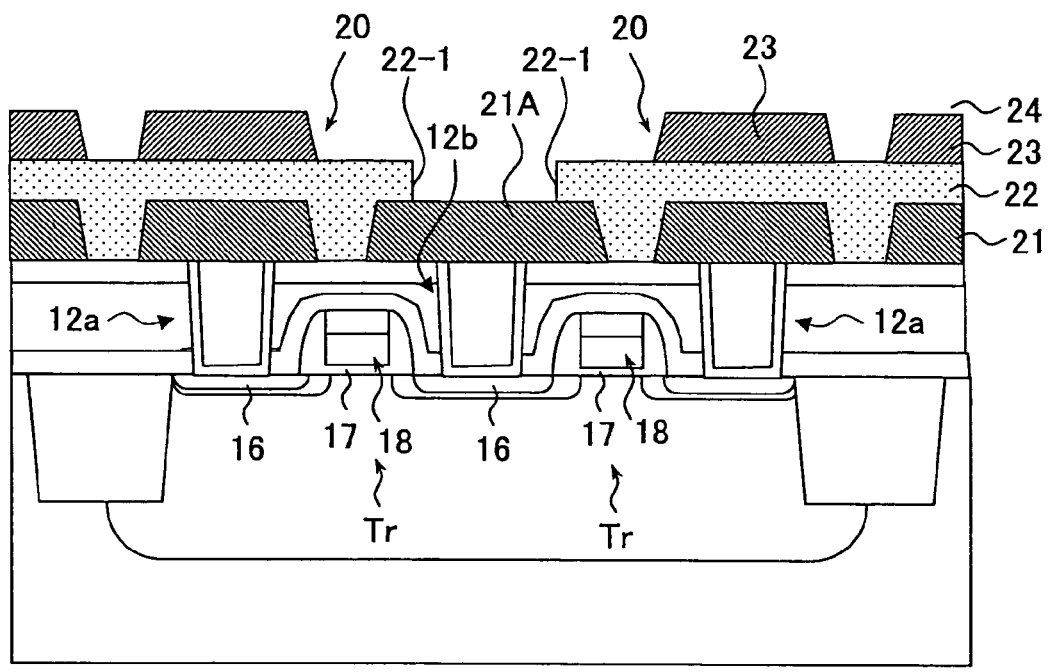

FIGS. 15-17 show the fabrication process of the semiconductor device shown in FIG. 14.

First, as shown in FIG. 15, an interlayer insulation film 44 and an insulation film 15 are deposited consecutively so as to cover the transistor Tr, and an opening 45 is formed through the interlayer insulation film 44 and the insulation film 15 so as to expose the impurity diffusion region 16 of the transistor Tr. Next, the conductive plugs 12a and 12b are filled with tungsten via a Ti/TiN thin film, for example. For the insulation film 15, it is possible to use an SiON film, an alumina film or a titania film similarly to the first embodiment. With such an insulation film 15, it becomes possible to protect the conductive plugs 12a and 12b from the oxidation associated with the heat treatment to be conducted in the later processes.

After formation of the conductive plugs 12a and 12b, the lower electrode 21 is formed on the exposed surface of the conductive plug 12a so as to satisfy the foregoing condition (1) similarly to the first embodiment. Simultaneously to the formation of the lower electrode 21, an electrode pad 21A is formed on the exposed surface of the conductive plug 12b.

The electrode pad 21A is formed by patterning the same conductive film of the lower electrode 21. Thus, the electrode pad 21A is formed in the same layer as the lower electrode with the same material and with generally the same thickness.

Here, the interval between the electrode pad 21A and the lower electrode 21 is set so as to satisfy the condition (3) with regard to the thickness $T_{FER}$ of the ferroelectric film to be formed in the next step $$Wa < T_{FER} \times 2 \quad (3)$$

Next, as shown in FIG. 16, there are formed the ferroelectric film 22 and the upper electrode film 23a so as to cover the electrode pad 21A and the entire substrate surface similarly to the step explained with reference to FIG. 5 of the first embodiment. It should be noted that the ferroelectric film 22 has a flat surface not only in the region where the adjacent lower electrodes 21 are arranged with the interval satisfying the condition (1) but also in the region where the interval Wa between the electrode pad 21A and the lower electrode 21 satisfies the condition (3) and where the bit line contact is formed.

Next, as shown in FIG. 17, the upper electrode film 23a is patterned in a predetermined shape to form the upper electrode 23 and a part of the electrode pad 21A is exposed by removing the ferroelectric film 22 by the RIE process as noted above. In the region where the bit line contact is formed, the surface of the ferroelectric film 22 is flat, and thus, the sidewall surface 22-1 of the ferroelectric film 22 thus formed on the electrode pad 21A reduces the area thereof significantly as compared with the first embodiment. Thereby, it becomes possible to suppress the penetration of water through the sidewall surface and causing reduction of the ferroelectric film 22 or escaping of Pb from the ferroelectric film 22. Further, with the present modification, there occurs no formation of residues of the upper electrode film 23a adhering on the sidewall of the ferroelectric film 22 contrary to the case of the first embodiment. Because the steps thereafter are similar to the processes from the annealing process of the ferroelectric film 22 in the step of FIG. 7A to the step of FIG. 8, further description thereof will be omitted.

Thus, according to the second modification of the first embodiment, it becomes possible to reduce the area of the sidewall of the ferroelectric film significantly, and degradation of the capacitor starting from the sidewall of the ferroelectric film is effectively prevented. Thereby, a more stabilized ferroelectric capacitor cell is constructed. Further, it is possible to reduce the number of the process steps by eliminating the plug oxidation protection film of the first embodiment.

Further, in the second modification, it is possible to use the oxidation protection structure of the conductive plug of the first embodiment.

Next, a second embodiment of the present invention will be described.

Figure 18:
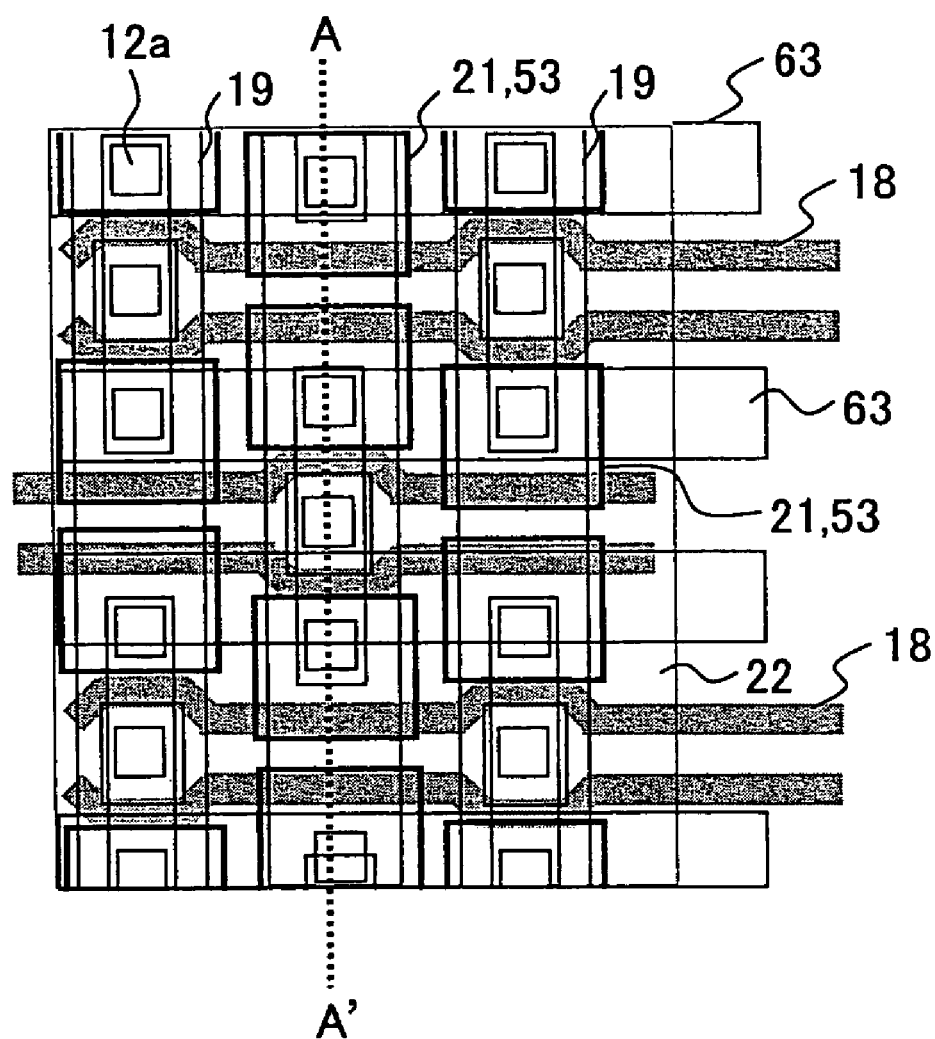
FIG. 18 is a top plan view of a semiconductor device according to a second embodiment of a present invention.
Figure 19:
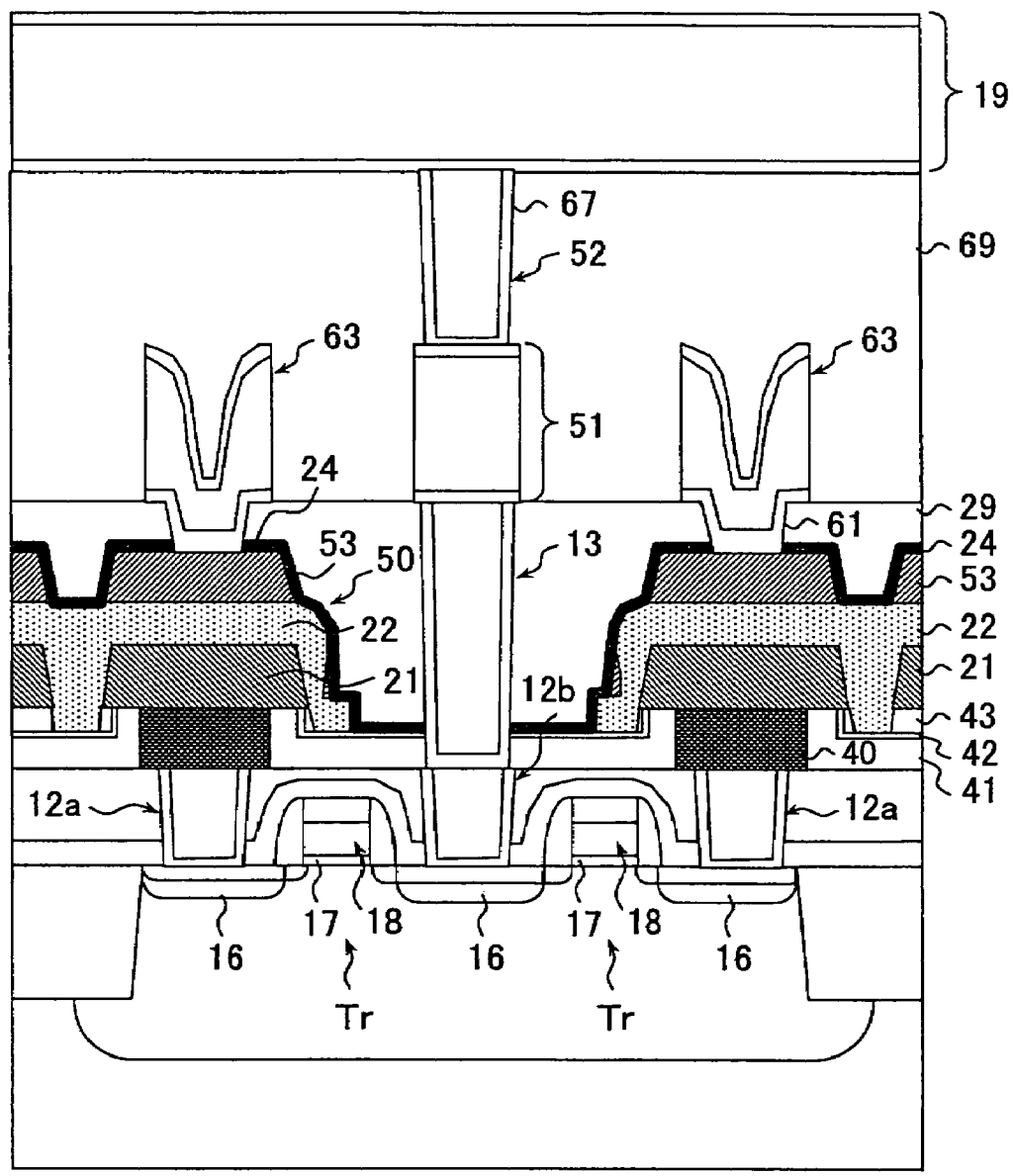
FIG. 19 is an A-A' cross-sectional view of the semiconductor device shown in FIG. 18.

FIGS. 18 and 19 are diagrams showing the semiconductor device according to a second embodiment of the present invention. FIG. 18 is a top plan view of the semiconductor device of the second embodiment, while FIG. 19 is a cross-sectional view taken along an A-A' line of FIG. 18.

In the first embodiment, the upper electrode 23 is patterned according to the shape of the plate line and the upper electrode 23 has been used also as the plate line. In the second embodiment, on the other hand, the upper electrode 53 is formed to have a shape corresponding to the lower electrode 21, and a plate line 63 is provided separately. Thus, the ferroelectric capacitor 50 is formed of the lower electrode 21, a part of the ferroelectric film 22 covering the lower electrode continuously, the part corresponding to the lower electrode, and an isolated upper electrode 43 opposing the lower electrode 21 across the ferroelectric film.

In the case of the ferroelectric capacitor, the upper electrode is required to endure the high temperature processing conducted for the crystallization of the ferroelectric material or for the improvement of the characteristics. Thus, there is a need of choosing a material having good crystal compatibility with the ferroelectric film for the ferroelectric capacitor. Thus, a noble metal material is used commonly for this purpose. However, such materials for the upper electrode tend to show a relatively large electric resistance and there may be a case in which improvement of device speed becomes difficult. Thus, with the second embodiment, in order to achieve high speed operation, the upper electrode is used only as an upper electrode and the plate line 63 is formed by another wiring layer.

The fabrication process of the semiconductor device shown in FIGS. 18 and 19 is the same as in the case of the first modification of the first embodiment up to the forming step of the bit line contact 13 of FIG. 9, except for the point that the patterning shape of the upper electrode 53 is different. While the process steps thereafter are not specifically illustrated, the bit line contact 12 is formed, and then, there is formed an oxidation prevention film on the interlayer insulation film 29 for preventing oxidation of the bit line plug 13. Thereafter, a hole 61 is formed so as to reach the upper electrode 53 of the capacitor 50. Further, the oxidation prevention film on the interlayer insulation film 29 is removed and a multilayer metal layer is formed inside the hole 61 and also on the entire surface of the interlayer insulation film 29. For example, the multilayer metal layer may be the one having a multilayer structure of Ti, Al, TiN, or the like. By patterning the multilayer metal layer into a predetermined shape, there are formed the plate line 63 connected to the upper electrode 52 and a conductive pad 51 connected to the bit line contact 13.

Thereafter, an interlayer insulation film 69 is deposited further, and a contact hole 67 is formed so as to reach the conductive pad 51. Further, a TiN film is formed on the inner wall of the contact hole 67, and the contact hole is filled with tungsten (W). With this, a second bit line contact 52 is formed. Further, the bit lien 19 of the multilayer wiring connected the second bit line contact 52 is formed thereon, and the semiconductor device (ferroelectric memory) shown in FIG. 19 is completed.

In the second embodiment, too, the ferroelectric film 22 covers the lower electrodes 21 continuously except for predetermined regions and is characterized by a flat surface between adjacent lower electrodes that satisfy the condition (1). Of course, it is possible to omit the adhesion film structure using the adhesion film 42 and construct the underlying film of the capacitor as in the case of the first embodiment.

With the second embodiment, it becomes possible to catch up with the increase of operational speed as a result of the use of the plate line, in addition to the effect of prevention of the capacitor degradation starting from the ferroelectric side wall and prevention of leakage between the upper and lower electrodes.

Figure 20:
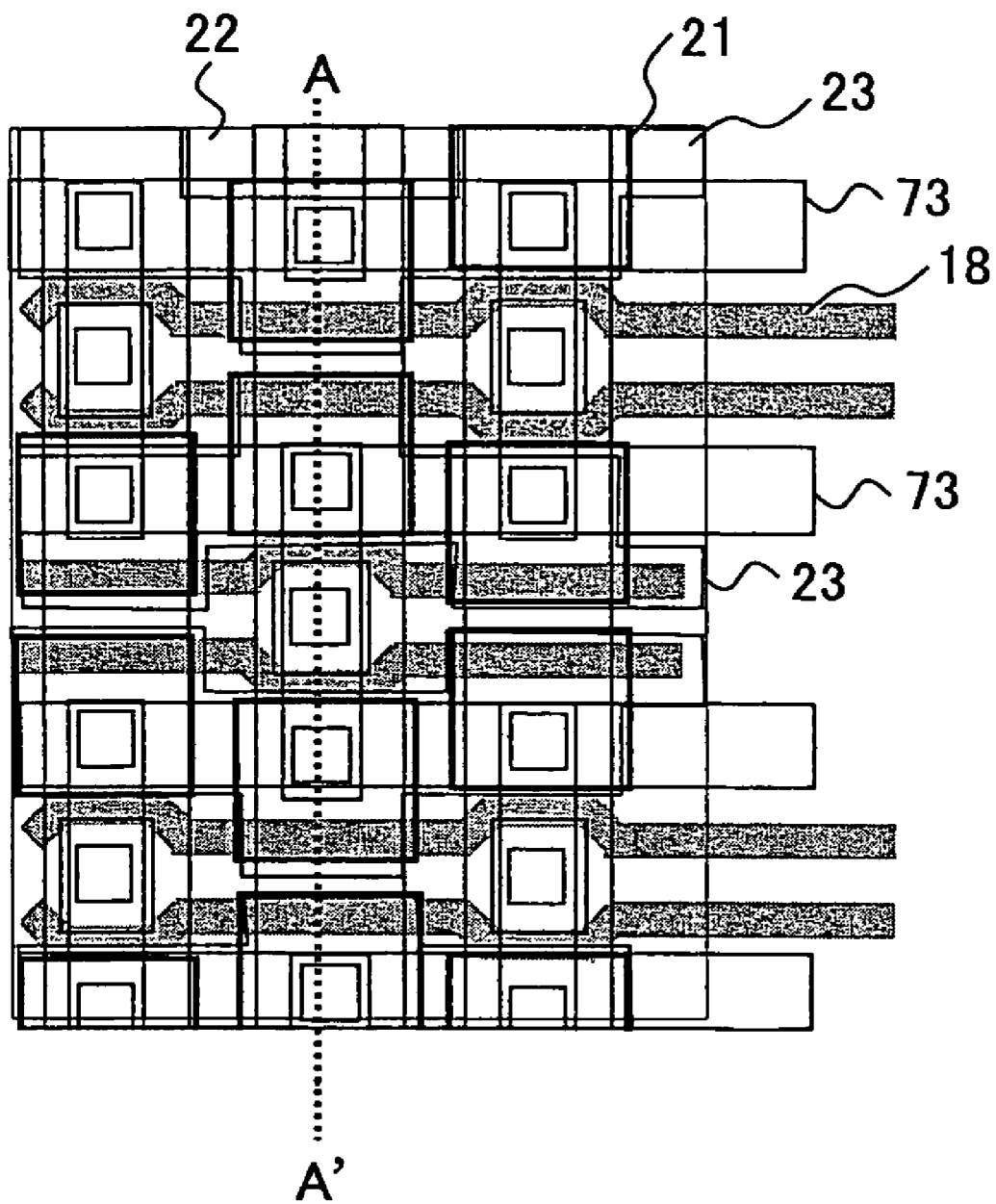
FIG. 20 is a top plan view of a modification of the semiconductor device of the second embodiment.
Figure 21:
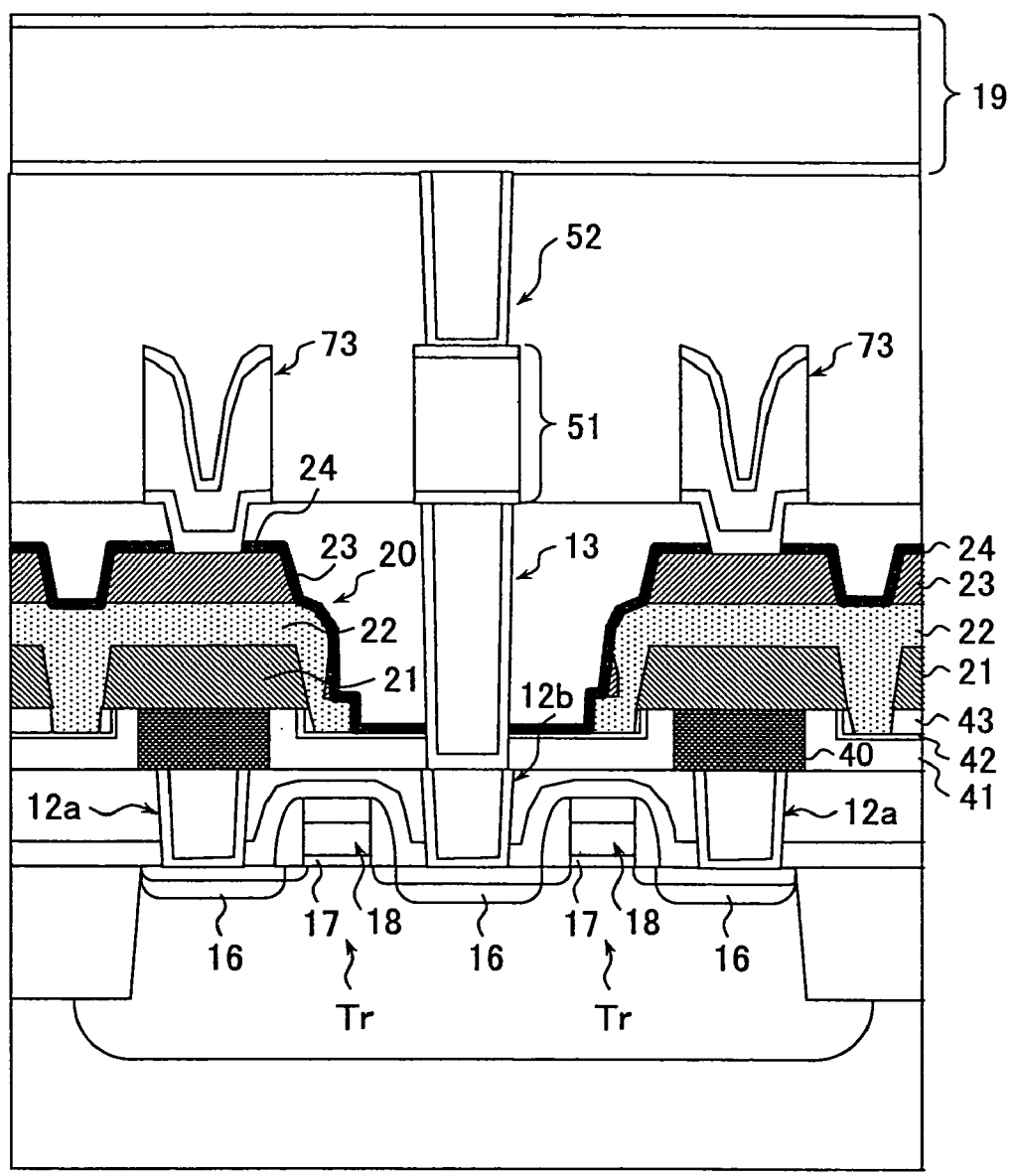
FIG. 21 is an A-A' cross-sectional view of the semiconductor device shown in FIG. 20.

FIGS. 20 and 21 are diagrams showing a modification of the semiconductor device according to the second embodiment. With this modification, the upper electrode 23 is patterned in the form of the plate line similarly to the first embodiment, and in addition, there is provided a second plate line of low resistance such that the second plate line 73 extends parallel to the upper electrode 23. With this, the overall resistance of the common electrode is reduced and the operational speed of the semiconductor device is improved.

Thus, the semiconductor device (ferroelectric memory) according to the present modification includes the plural lower electrodes 21 having a predetermined isolated pattern and connected to one of the impurity diffusion regions 16 of the transistors Tr, the ferroelectric film 22 covering the lower electrodes 21 except for the predetermined regions, the upper electrode 23 formed on the ferroelectric film 22 so as to oppose with the lower electrodes, the upper electrode 23 being patterned in a predetermined line pattern, and the plate line 73 connected to the upper electrode. Here, it should be noted that the ferroelectric film 22 has a flat surface in the region where the separation W between the lower electrodes 21 satisfies the condition (1). With this construction, it becomes possible to eliminate the capacitor degradation starting from the sidewall of the ferroelectric film, without using advanced one-step etching process. At the same time, improvement is attained in the operational speed and stability by the low resistance second plate line 73 provided in addition to the upper electrode 23 of the plate line shape.

In the example of FIG. 21, it should be noted that contact between the plate-like upper electrode and the low resistance plate line 73 is achieved for all of the capacitor cells 20, while the present invention is not limited to such an example, and it is also possible to construct such that the contact between the plate-like upper electrode 23 and the low-resistance plate line 73 is achieved only at the edge part of the memory cell.

Next, a third embodiment of the present invention will be described.

Figure 22:
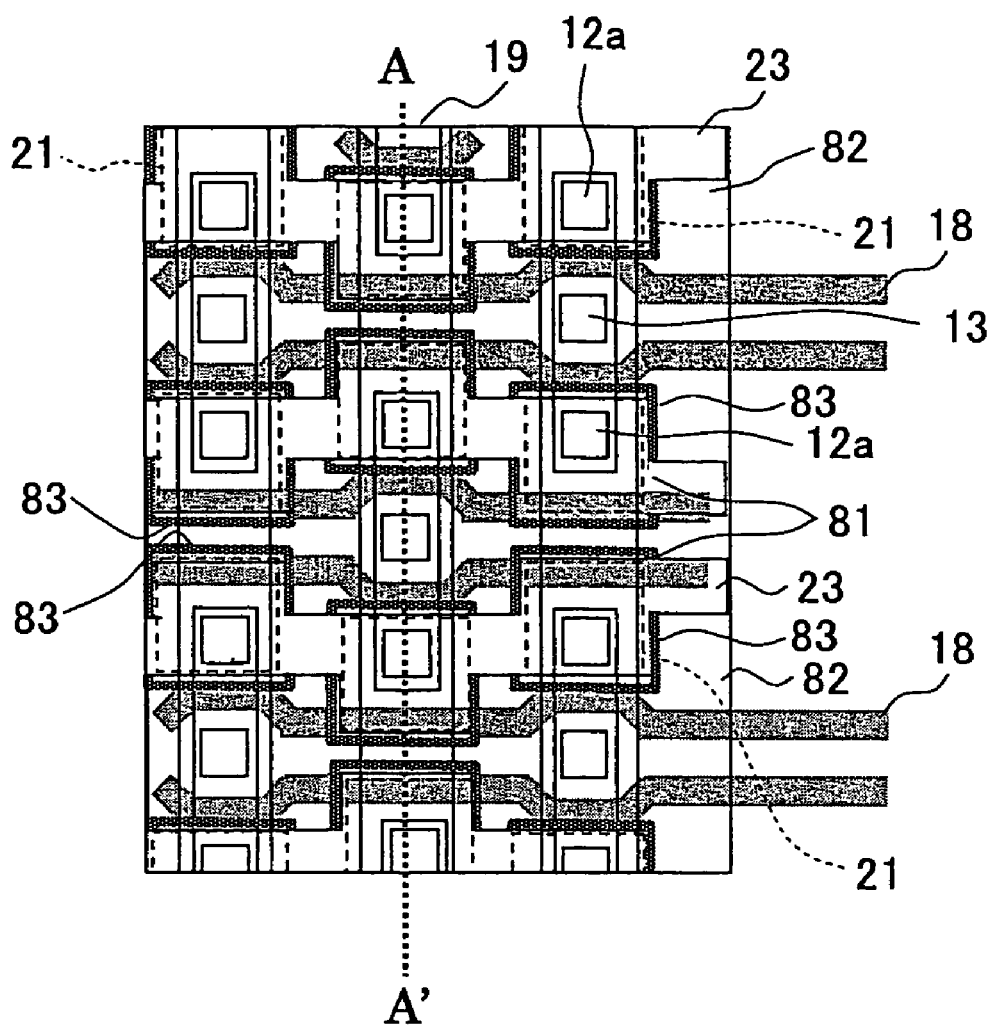
FIG. 22 is a top plan view of a semiconductor device according to a third embodiment of a present invention.
Figure 23:
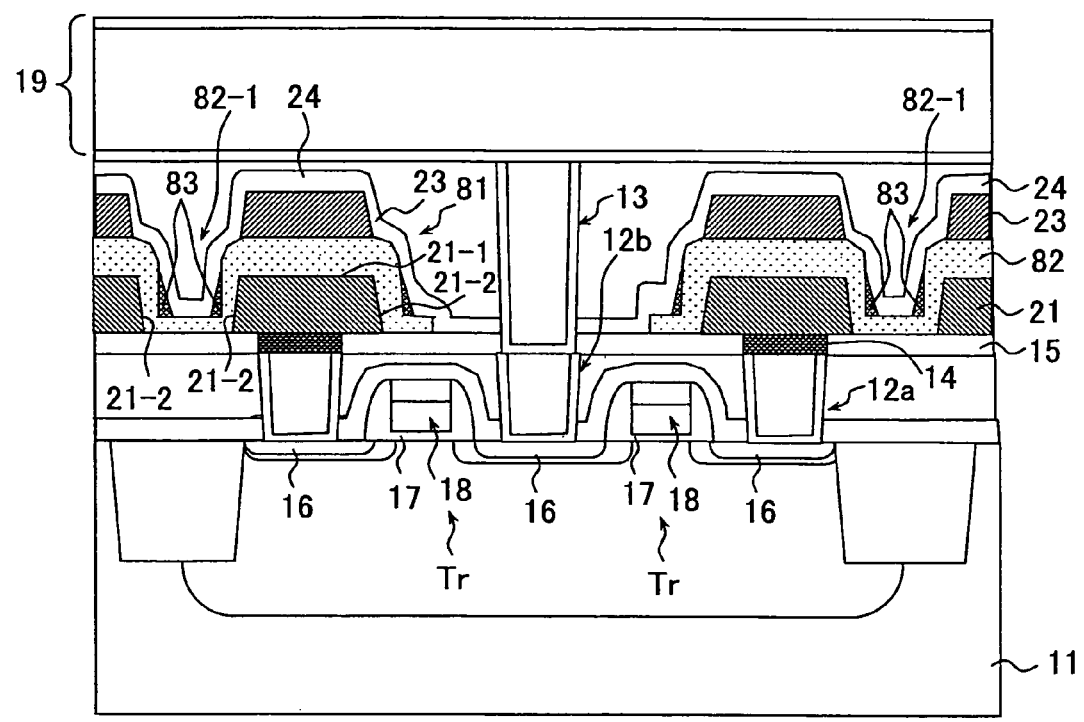
FIG. 23 is an A-A' cross-sectional view of the semiconductor device shown in FIG. 22.

FIGS. 22 and 23 are diagrams showing the semiconductor device according to a third embodiment of the present invention, wherein FIG. 22 is a top plan view of the semiconductor device of the third embodiment, while FIG. 23 is a cross-sectional view of FIG. 22 taken along the line A-A' of FIG. 22. In the drawings, those parts corresponding to the parts explained previously are designated by the same reference numerals and the description thereof will be omitted.

As shown in FIGS. 22 and 23, the semiconductor device according to the third embodiment includes the transistors Tr formed on the semiconductor substrate, the plural lower electrodes 21 each connected to one of the diffusion regions 16 of the corresponding transistor Tr, a ferroelectric film 82 covering the surface 21-1 and the sidewall surface 21-1 of the plural electrodes 21 continuously except for the predetermined regions, and the upper electrode 23 provided on the ferroelectric film 22 so as to oppose with the lower electrodes 21, wherein the lower electrode 21, the part of the ferroelectric film 82 corresponding to the lower electrode 21 and the upper electrode 23 opposing the lower electrode constitute a ferroelectric capacitor 81.

The semiconductor device according to the third embodiment has a construction similar to that of the semiconductor device of the first embodiment, except that the ferroelectric film 82 covers the surface 21-1 and the sidewall surface 21-3 of the lower electrode 21 and that there is formed a stepped part 82-1 in correspondence to the shape of the lower electrode 21.

Figure 24:
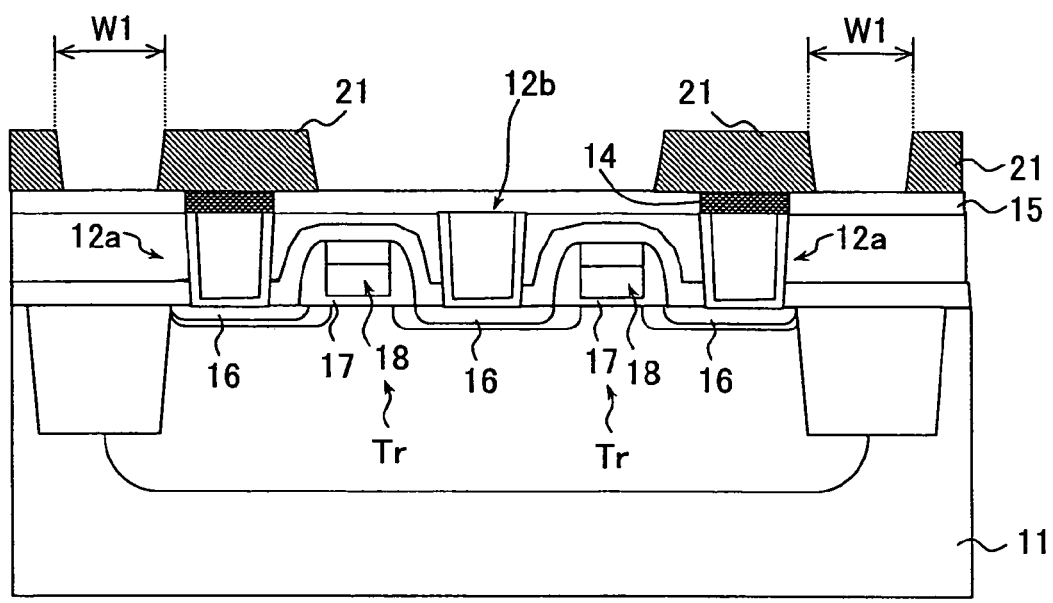
FIGS. 24, 25A and 25B are cross-sectional view diagrams and a corresponding plan view diagram showing the fabrication process of the semiconductor device according to the third embodiment.

FIGS. 24 and 25 show the fabrication process of the semiconductor device shown in FIGS. 22 and 23.

First, as shown in FIG. 24, the structure up to the lower electrode 21 is formed similarly to the steps of FIGS. 4A and 4B of the first embodiment. Here, the lower electrode 21 is formed such that the interval W1 between the lower electrodes is larger as compared with the interval W satisfying the condition (1) of the first embodiment with regard to the film thickness $T_{FER}$ of the ferroelectric film to be formed in the next step except for the regions where the bit line contacts are formed.

Figure 25A:
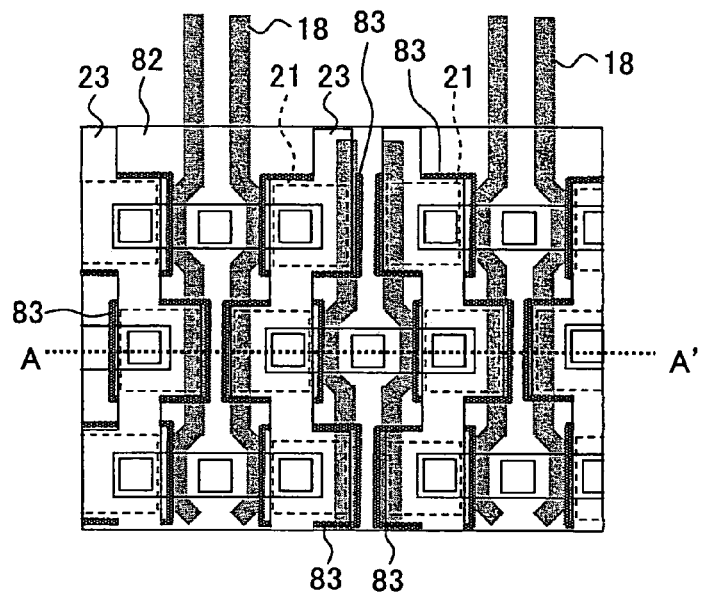
Figure 25B:
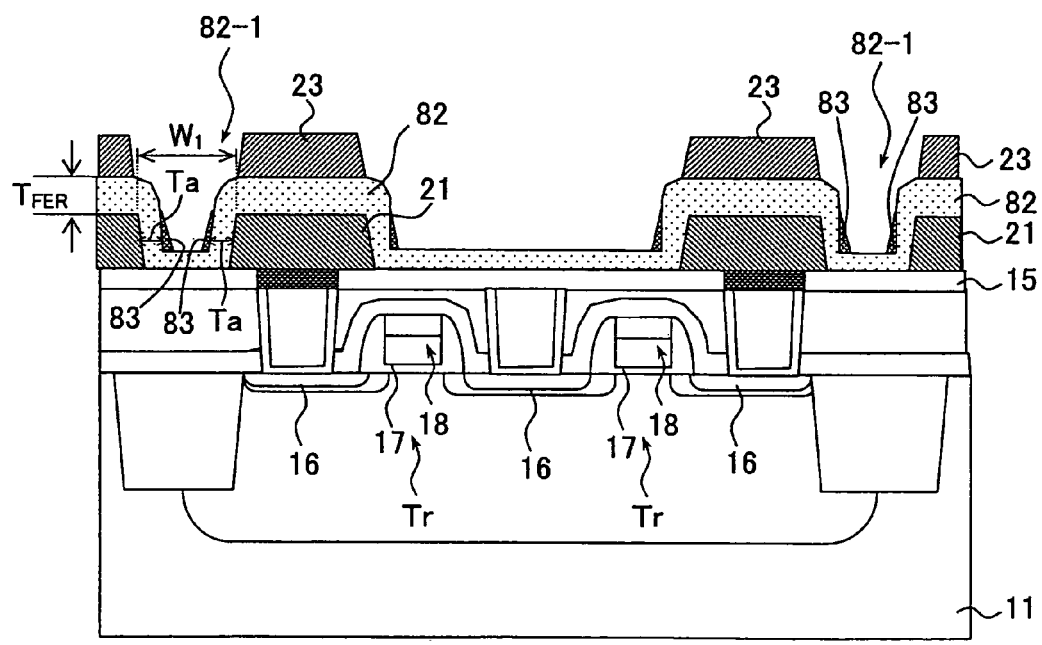

Next, as shown in top plan view of FIG. 25A and in the A-A' cross-sectional view of FIG. 25B, the ferroelectric film 82 is formed similarly to he steps of FIGS. 5-6B of the first embodiment, and an upper electrode film (not illustrated) is formed so as to cover the ferroelectric film 82. Further, as a result of patterning of the upper electrode film by an RIE process, the upper electrode 23 is formed. Here, it should be noted that the upper electrode 23 is formed so as to extend in the plate line direction, and as such, the upper electrode 23 functions also as the plate line. The ferroelectric film 82 is formed so as to cover the surface 21-1 and the sidewall surface 21-2 of the lower electrode 21 and further the surface of the insulation film 15. On the surface of the ferroelectric film 82, there is formed a stepped part 82-1 in correspondence to the shape of the surface 21-1 and the sidewall surface 21-2 of the lower electrode, and there is deposited a residue 83 of the upper electrode film so as to surround the sidewall surface of the stepped part 82-1, in which the upper electrode film has been removed by the RIE process. Because the ferroelectric film 82 covers the sidewall surface 21-2 of the lower electrode 21, there is no risk with such a construction that the residue 83 causes short circuit between the upper electrode 23 and the lower electrode 21. Further, by choosing the distance W1 between the lower electrodes 21, the lateral thickness Ta of the ferroelectric film 82, and the like, appropriately, it is possible to prevent short circuit between adjacent upper electrodes 23 via the residue 83.

As the process steps thereafter are similar to those explained with reference to FIGS. 7A-8, further description will be omitted.

Thus, with the semiconductor device according to the third embodiment of the present invention, it becomes possible to prevent the short circuit between the upper electrode 23 and the lower electrode 21 or between the adjacent upper electrodes 23 via the residue 83 deposited on the sidewall surface of the stepped part 82-1 in the case such a stepped part is formed on the surface of the ferroelectric film, and it becomes possible to realize a highly reliable semiconductor device in which the concern of capacitor leakage is eliminated.

While explanation has been made in the semiconductor device of the third embodiment for the case in which the stepped part 82-1 is formed in the direction in which the plate line extends, it is possible to reduce the interval between the lower electrodes adjacent in this direction such that no stepped part is formed on the surface of the ferroelectric film 82. In this case, the upper electrode 23 is formed on the flat surface of the ferroelectric film 82 such that the upper electrode 23 forms also the plate line similarly to the case of the first embodiment. Further, it is also possible to form the upper electrode 53 in the form of the isolated electrode and provide the plate line 63 connecting the upper electrodes 53.

Figure 26:
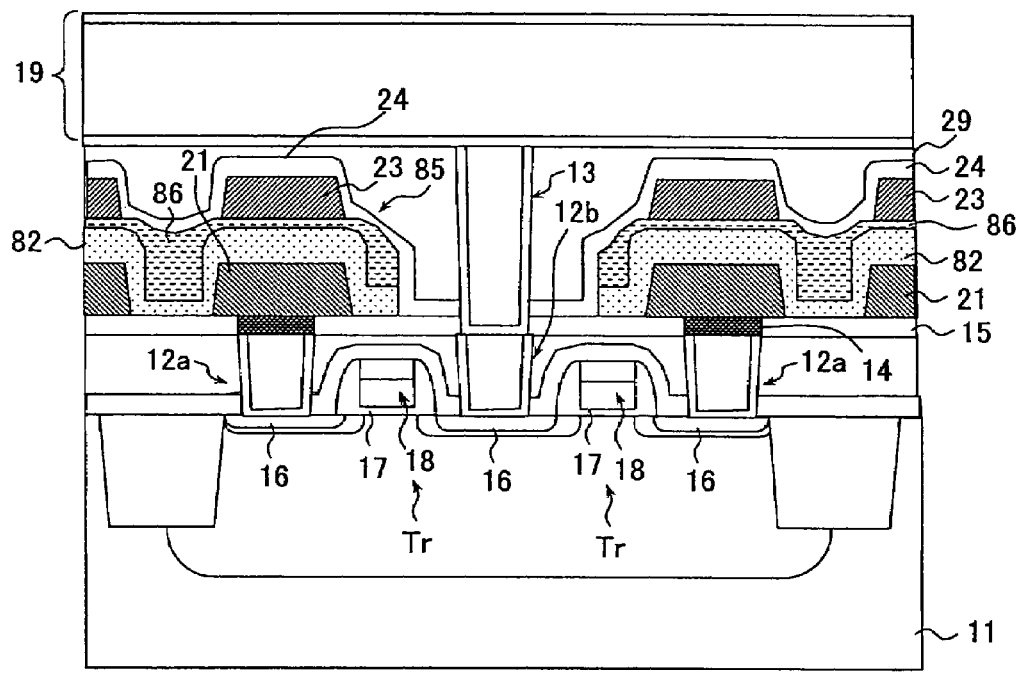
FIG. 26 is a cross-sectional view showing a first modification of the semiconductor device of the third embodiment.

FIG. 26 is a diagram showing a first modification of the semiconductor device of the third embodiment. In the drawings, those parts corresponding to the parts explained previously are designated by the same reference numerals and the description thereof will be omitted.

As shown in FIG. 26, with the semiconductor device of the first modification, there is provided a second ferroelectric film 86 covering the surface of the ferroelectric film 82 so as to fill the stepped part thereof. Thus, the ferroelectric capacitor 85 is formed of a lamination of lower electrode 21/ferroelectric film 82/second ferroelectric film 86/upper electrode 23. Because there is formed no steep steps on the surface of the second ferroelectric film 86, it is possible to prevent occurrence of the residue 83 of the upper electrode film such as the one taking place on the sidewall surface 82-1 of the ferroelectric film 82 of the third embodiment.

In the third embodiment explained above, it will be noted that there is a need of increasing the distance between the lower electrodes such that adjacent upper electrodes do not cause short circuit by the residue as explained before, while such a construction causes degradation in the efficiency of surface area utilization. Further, because the degree of exposure of sidewall surface of the ferroelectric film is increased as compared with the case of the first embodiment, such a construction is more susceptible to degradations caused in the process steps thereafter. Thus, with the first modification of the third embodiment, the problem of degradation of efficiency of surface area utilization by providing the second ferroelectric film 86 while simultaneously achieving decrease of the surface area of the sidewall surface of the ferroelectric film.

Figure 27:
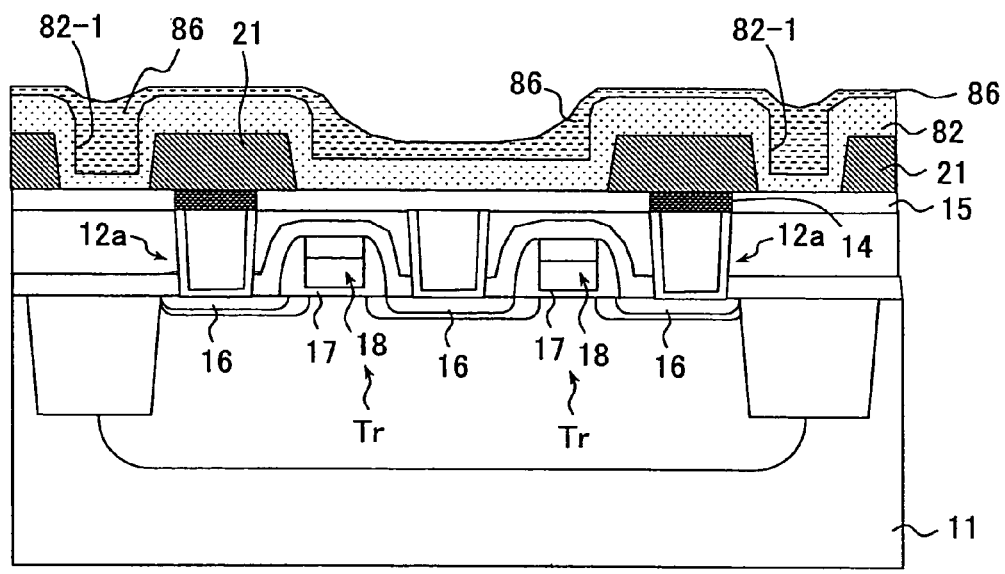
FIGS. 27 and 28 are cross-sectional view diagrams showing the fabrication process of the first modification of the third embodiment.
Figure 28:
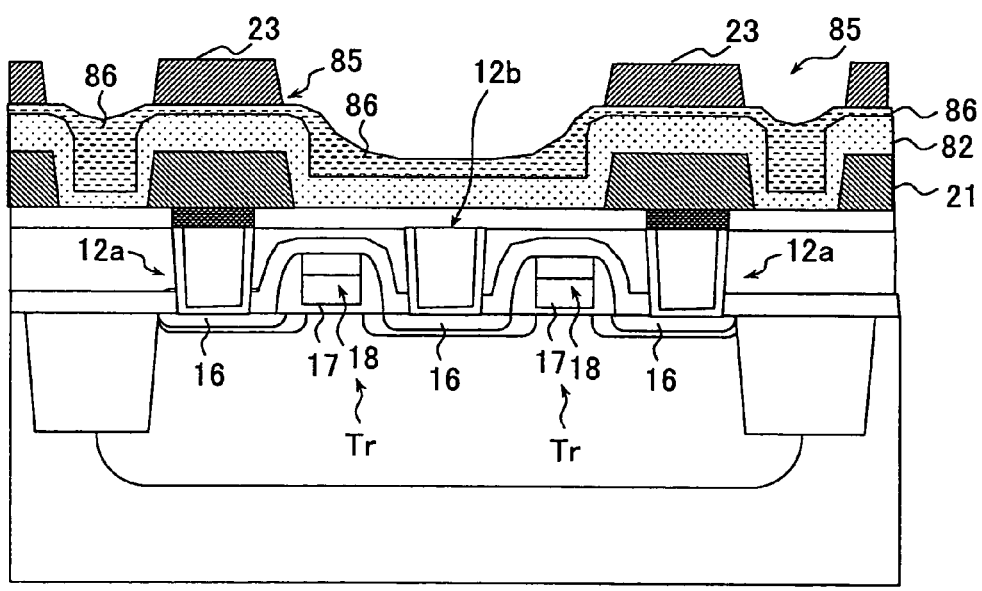

FIGS. 27 and 28 are diagrams showing the fabrication process of the semiconductor device shown in FIG. 26.

First, as shown in FIG. 27, the process steps of the third embodiment are conducted up to the step of forming the ferroelectric film 82 of FIGS. 24 and 25. Next, the second ferroelectric film 86 is formed on the surface of the ferroelectric film 82 with the thickness of about 100 nm. The second ferroelectric film 86 forms a PZT precursor by using a PZT precursor solution applied by a spin coating process. For the PZT precursor solution, a commercially available PZT film forming agent (PZT113/45/45, 15 mass percent concentration) is used and dripped upon the ferroelectric film with an amount of about 0.3 cm3 while rotating for 20 seconds with the speed of 3000 rpm. Here, PZT113/45/55 means that Pb, Zr and Ti are contained with respective molar concentration ratio of 113:45:45. Next, the substrate is heated to about 350° C. such that the solvent in the PZT film forming agent is evaporated. Thereafter, the substrate is cooled to the room temperature. Next, by using a halogen lamp annealing apparatus, crystallization is made in the PZT film. More specifically, the substrate is set upon a halogen lamp annealing apparatus and heating is made at about 650° C. for 10 minutes while flowing an oxygen gas.

By forming the second ferroelectric film 86 by a spin coating process while using such a PZT precursor solution, the stepped part 82-1 is filled and exposure of the sidewall surface of the second ferroelectric film 86 is suppressed. Here, it should be noted that formation of the second ferroelectric film 86 is not limited to a spin coating process but it is also possible to use a MO-CVD process that provides excellent step coverage, for example. Further, the second ferroelectric film 86 is not limited to a PZT film but any other ferroelectric material having perovskite crystal structure such as a PLZT film or an SBT film may be used. Thereby, it is preferable to choose the ferroelectric material that achieves good crystal matching with the ferroelectric film.

Next, as shown in FIG. 28, the upper electrode 23 is formed on the second ferroelectric film 86 with a predetermined shape similarly to FIG. 25 of the third embodiment. Because the top surface of the second ferroelectric film 86 forms a near flat surface, it is possible to prevent occurrence of residues of the upper electrode, while this process can decrease the interval between the lower electrodes 21 and improve the efficiency of utilization of surface area.

Thereafter, the steps similar to those shown in FIGS. 7A-8 are conducted except for the point of forming the bit line contact through the second ferroelectric film 86. The description thereof will be omitted.

Thus, with the first modification of the third embodiment, it is possible to reduce the steps in the ferroelectric film 82 and reduce the exposure of the sidewall surface of the second ferroelectric film 86. Further, it becomes possible to prevent occurrence of residues and improve the efficiency of utilization of the surface area.

Figure 29:
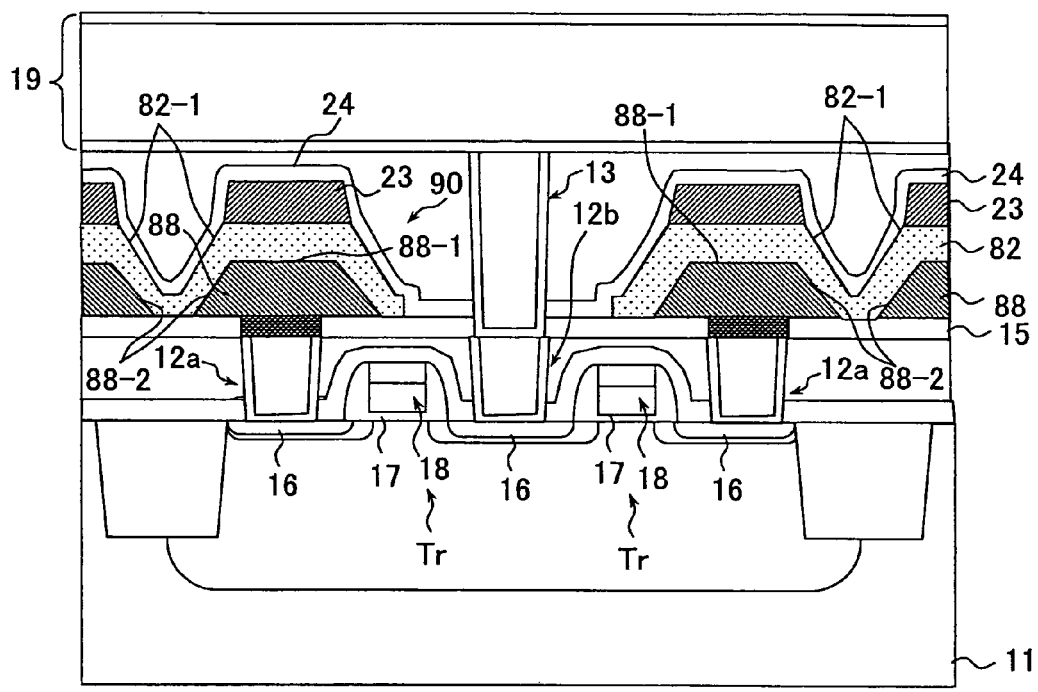
FIG. 29 is a cross-sectional view showing a second modification of the semiconductor device according to the third embodiment.

FIG. 29 is a diagram showing a second modification of the semiconductor device according to the third embodiment, wherein those parts in the drawings corresponding to the parts explained previously are designated by the same reference numerals and the description thereof will be omitted.

As shown in FIG. 29, the semiconductor device according to the second modification of the third embodiment has a construction similar to that of the third embodiment except that there is provided a lower electrode 88 having a tapered shape expanding toward the downward direction, that the ferroelectric film 82 covers a surface 88-1 and a sidewall surface 88-2 of the lower electrode 88 and that the ferroelectric film 82 has a tapered surface 82-1 corresponding to the surface shape of the lower electrode 88.

It should be noted that the lower electrode 88 of such a tapered shape can be formed by forming a tip mask on the lower electrode (the continuous film before the lower electrode is formed by etching), with the size of the lower surface of the lower electrode, and further by patterning the lower electrode 88 by an isotropic etching process or an anisotropic etching process that works predominantly in the thickness direction but also in the in-plane direction. With such a patterning method, the surface 88-1 of the lower electrode contacting the tip mask undergoes more in-plane etching over the bottom surface of the lower electrode 88, and thus, there is formed a tapered surface for the sidewall surface 88-2.

Next, the ferroelectric film 82 and the upper electrode layer 23 are formed similarly to the case of the third embodiment. In correspondence to the shape of the lower electrode 88, the ferroelectric film 82 has a tapered shape at the sidewall surface 82-1, and thus, the removal of the upper electrode film covering this part is achieved easily. As a result, it becomes possible to prevent occurrence of residues of the upper electrode film. Further, because the ferroelectric film 82 covers the sidewall surface 88-1 of the lower electrode 88 more completely, short circuit between the upper electrode and the lower electrode is prevented more effectively.

Thus, with the second modification of the third embodiment, short circuit between the upper electrode 23 and the lower electrode 88 or short circuit between adjacent upper electrodes 23 can be prevented by forming the lower electrode 88 to have a tapered form, and it becomes possible to realize a highly reliable semiconductor device wherein concern of capacitor leakage is eliminated.

Further, while explanation has been made for previous embodiments of the present invention, the present invention is not limited to such a particular embodiment, and various variations and modifications can be made within the scope of the present invention described in the claims.

As explained heretofore, the ferroelectric film covers the surface and the sidewall surface of the capacitor lower electrode and leakage between the lower electrode and the upper electrode is effectively prevented. Thereby a semiconductor device having improved efficiency of utilization of surface area is provided.

Further, exposure of the capacitor ferroelectric sidewall surface is reduced and a semiconductor device having a reduced deterioration of ferroelectric film is provided.

Further, as a result of not using the advanced high temperature etching process, it becomes possible to provide a semiconductor device in which adversary effect to the ferroelectric film throughout the fabrication process is provided.

Further, the problem of capacitor leakage that may occur as a result of the one-step etching of the upper electrode, the ferroelectric film and the lower electrode is eliminated.

What is claimed is:

1. A semiconductor device, comprising:
    a plurality of lower electrodes electrically connected to one of impurity diffusion regions of transistors formed on a semiconductor substrate;
    a ferroelectric film covering a surface and a sidewall surface of said plural lower electrodes;
    an upper electrode provided on said ferroelectric film so as to oppose with said lower electrode; and
    said ferroelectric film having a planarized top surface over a part filling a gap between a pair of said lower electrodes,
    wherein said ferroelectric film covers said plural lower electrodes continuously except for a predetermined region,
    said plural lower electrodes being disposed with a predetermined interval so as to satisfy a relation $W < T_{FER} \times 2$ except for said predetermined region, wherein W represents an interval between said lower electrodes and TFER represents a thickness of said ferroelectric film.

2. The semiconductor device as claimed in claim 1, further comprising:
    another conductive plug contacting with another impurity diffusion region of said transistors; and
    an electrode pad forming an identical layer to said lower electrode and covering a surface and also a surrounding part of said another conductive plug,
    said electrode pad being disposed so as to satisfy a relationship $Wa < T_{FER} \times 2$ where Wa represents an interval between said electrode pad and said lower electrode and $T_{FER}$ represents the thickness of the ferroelectric film.

3. The semiconductor device as claimed in claim 1, further comprising:
    a conductive plug connecting said lower electrode to said another impurity diffusion region;
    a plug oxidation prevention film interposed between said conductive plug and said lower electrode so as to cover a surface of said conductive plug and a surrounding part;
    an insulation film forming an identical layer to said plug oxidation prevention film, said insulation layer covering a region other than a surface and a surrounding part of said conductive plug; and
    an adhesive film interposed between said insulation film and said ferroelectric film, said adhesive film having high adhesion with said ferroelectric film,
    wherein there holds a relationship $t1 \geq t2 + t3$ where t1 represents the thickness of the plug oxidation prevention film, t2 represents the thickness of the insulation film and t3 represents the thickness of the adhesion film.

4. The semiconductor device as claimed in claim 3, wherein said adhesive film is selected from any of an aluminum oxide film, a titanium oxide film and a PZT film.

5. The semiconductor device as claimed in claim 3, wherein said plug oxidation prevention film comprises any of an Ir film or an Ir oxide film.

6. The semiconductor device as claimed in claim 3, wherein said insulation film comprises an SiON film or an alumina film.

7. The semiconductor device as claimed in claim 1, wherein said upper electrode has a shape of a plate line and functioning also as a plate line.

8. The semiconductor device as claimed in claim 1, further comprising a capacitor protection film covering said upper electrode and said ferroelectric film.

9. The semiconductor device as claimed in claim 1, wherein said ferroelectric film has a surface in which there is formed a stepped part corresponding to a surface and a sidewall surface of said lower electrode.

10. The semiconductor device as claimed in claim 9, further comprising another ferroelectric film covering a surface of said ferroelectric film, said another ferroelectric film filling said stepped part.

11. The semiconductor device as claimed in claim 1, wherein lower electrode has a tapered sidewall surface expanding toward a downward direction.

12. The semiconductor device according to claim 1, wherein a portion of said gap is free of said ferroelectric film.

13. The semiconductor device according to claim 1, wherein said gap is completely filled with said ferroelectric film.

14. The semiconductor device according to claim 1, wherein said planarized top surface of said ferroelectric film has a level, in said gap, substantially the same level of said planarized top surface of said ferroelectric film in a part located over said pair of lower electrodes.

15. A semiconductor device, comprising:
    a plurality of lower electrodes electrically connected to one of impurity diffusion regions of transistors formed on a semiconductor substrate;
    a ferroelectric film covering a surface and a sidewall surface of said plural lower electrodes; and
    an upper electrode provided on said ferroelectric film so as to oppose with said lower electrode,
    said ferroelectric film having a planarized top surface over a part filling a gap between a pair of said lower electrodes,
    wherein said ferroelectric film covers said plural lower electrodes continuously except for a predetermined region,
    said plural lower electrodes being disposed with a predetermined interval so as to satisfy a relationship $W < T_{FER} \times 2$ except for said predetermined region, wherein W represents a distance between said lower electrodes and $T_{FER}$ represents a thickness of said ferroelectric film.

* * * * *